United States Patent
Qin

(10) Patent No.: US 11,716,075 B2
(45) Date of Patent: Aug. 1, 2023

(54) BUFFER CIRCUIT, FREQUENCY DIVIDING CIRCUIT, AND COMMUNICATIONS DEVICE

(71) Applicant: HUAWEI TECHNOLOGIES CO., LTD., Guangdong (CN)

(72) Inventor: Lin Qin, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 17/389,448

(22) Filed: Jul. 30, 2021

(65) Prior Publication Data

US 2021/0359671 A1 Nov. 18, 2021

Related U.S. Application Data

(63) Continuation of application No. PCT/CN2019/074222, filed on Jan. 31, 2019.

(51) Int. Cl.
- *H03K 5/01* (2006.01)
- *H03K 5/00* (2006.01)
- *H03K 17/687* (2006.01)

(52) U.S. Cl.
CPC .......... *H03K 5/01* (2013.01); *H03K 5/00006* (2013.01); *H03K 17/6872* (2013.01); *H03K 2005/00019* (2013.01)

(58) Field of Classification Search
CPC .. H03K 5/01; H03K 5/00006; H03K 17/6872; H03K 2005/00019; H03K 23/40;
(Continued)

(56) References Cited

U.S. PATENT DOCUMENTS

| 4,101,790 A * | 7/1978 | Ebihara | G11C 19/18 327/241 |
| 5,463,340 A * | 10/1995 | Takabatake | G11C 19/28 327/201 |

(Continued)

FOREIGN PATENT DOCUMENTS

| CN | 101355353 A | 1/2009 |
| CN | 101557211 A | 10/2009 |

(Continued)

OTHER PUBLICATIONS

International Search Report and Written Opinion issued in PCT/CN2019/074222, dated Oct. 28, 2019, 10 pages.

(Continued)

*Primary Examiner* — Ryan Jager

(57) ABSTRACT

A buffer circuit, a frequency dividing circuit, and a communications device are disclosed. The buffer circuit includes a buffer, a first control circuit, and a second control circuit. The buffer is coupled to a frequency divider, and the buffer is configured to receive a first signal output by the frequency divider, and output a fourth signal by using an output terminal of the buffer circuit when driven by the first signal, where the first signal is obtained by the frequency divider by performing frequency division on a group of differential signals, and the differential signals include a second signal and a third signal. The first control circuit is configured to perform delay control on a rising edge of the fourth signal based on the second signal. The second control circuit is configured to perform delay control on a falling edge of the fourth signal based on the third signal.

15 Claims, 15 Drawing Sheets

(58) Field of Classification Search
CPC .......... H03K 19/018521; H03K 17/28; H03K 21/023
USPC ..................................................... 327/276
See application file for complete search history.

(56) References Cited

U.S. PATENT DOCUMENTS

| | | | | |
|---|---|---|---|---|
| 6,348,824 B1* | 2/2002 | Grondalski | ............ | H03K 3/012 327/201 |
| 6,448,830 B1* | 9/2002 | Chuang | ................ | H03K 3/3565 327/205 |
| 6,573,774 B1* | 6/2003 | Gardner | ............... | H03K 3/0375 327/201 |
| 7,071,749 B2* | 7/2006 | Gardner | ............... | H03K 3/0375 327/202 |
| 7,212,056 B1* | 5/2007 | Belov | ............. | H03K 3/356173 327/210 |
| 7,602,877 B2* | 10/2009 | Shimada | ................ | H03K 23/44 327/117 |
| 7,683,670 B2* | 3/2010 | Cheng | ............ | H03K 19/018585 326/83 |
| 7,728,386 B2* | 6/2010 | Kojima | ............. | H01L 29/66659 257/369 |
| 7,940,083 B2* | 5/2011 | Yamashita | ....... | H03K 19/00384 326/82 |
| 8,487,669 B2* | 7/2013 | Hesen | ................... | H03K 21/12 327/115 |
| 8,497,701 B2* | 7/2013 | Clerc | ............... | H03K 19/00338 326/28 |
| 8,797,069 B2* | 8/2014 | Hesen | .................. | H03K 21/026 327/115 |
| 8,928,428 B2* | 1/2015 | Gorbachov | ............. | H01P 5/185 333/109 |
| 9,088,285 B2* | 7/2015 | Goldblatt | ................ | H03K 21/17 |
| 9,093,734 B2* | 7/2015 | Gorbachov | ............. | H01P 5/184 |
| 9,143,117 B2* | 9/2015 | Wen | ...................... | H03K 3/0375 |
| 10,262,704 B1* | 4/2019 | Sato | ........................ | G11C 7/222 |
| 10,840,914 B1* | 11/2020 | Tavakol | ................ | H03K 23/667 |
| 2004/0257122 A1* | 12/2004 | Mori | ................. | G01R 31/31727 327/78 |
| 2006/0156049 A1* | 7/2006 | Helio | ..................... | H03K 23/54 713/500 |
| 2007/0009077 A1* | 1/2007 | Widerin | ........... | H03K 3/356104 377/64 |
| 2010/0039153 A1* | 2/2010 | Qiao | ...................... | H03L 7/0812 327/254 |
| 2010/0213986 A1* | 8/2010 | Payne | ................... | H03M 1/002 327/108 |
| 2011/0012647 A1* | 1/2011 | Qiao | ...................... | H03K 21/00 327/117 |
| 2012/0081156 A1* | 4/2012 | Hesen | ....................... | C07F 7/08 327/115 |
| 2013/0293272 A1* | 11/2013 | Hesen | .................... | H03K 21/00 327/115 |
| 2014/0266350 A1 | 9/2014 | Cheng et al. | | |

FOREIGN PATENT DOCUMENTS

| | | |
|---|---|---|
| CN | 104335488 A | 2/2015 |
| GB | 2415844 B | 5/2006 |
| WO | 2012100226 A1 | 7/2012 |

OTHER PUBLICATIONS

Extended European Search Report dated Jan. 10, 2022 issued in European Application No. 19912874.5 (13 pgs.).

* cited by examiner

BUFFER CIRCUIT, FREQUENCY DIVIDING CIRCUIT, AND COMMUNICATIONS DEVICE

CROSS-REFERENCE TO RELATED APPLICATIONS

This application is a continuation of International Application No. PCT/CN2019/074222, filed on Jan. 31, 2019, the disclosure of which is hereby incorporated by reference in its entirety.

TECHNICAL FIELD

Embodiments of this application relate to the communications field, and in particular, to a buffer circuit, a frequency dividing circuit, and a communications device.

BACKGROUND

In a wireless fidelity (Wi-Fi) transmitter, after a frequency dividing circuit performs frequency division on a clock signal with a duty ratio of 50%, two frequency-divided signals: an in-phase (I) signal and a quadrature-phase (Q) signal (namely, IQ signals, or denoted as I/Q signals), are obtained. The frequency-divided clock signal is mixed with a baseband signal obtained after filtering of a low-pass filter, to obtain mixed radio frequency signals, and then the radio frequency signals are output.

To increase a degree of separation between the IQ signals, the mixed radio frequency signals are amplified by a pre-power amplifier (PPA) circuit, and then added, and an added signal is finally output from a chip by using a power amplifier (PA) circuit.

Because the frequency dividing circuit generates noise in a frequency dividing process, after the clock signal passes through the frequency dividing circuit, noise of the frequency dividing circuit is introduced. Because the frequency-divided clock signal is amplified by the PPA circuit, the noise generated by the frequency dividing circuit is further amplified. Therefore, a buffer circuit used to cancel phase noise generated by a frequency dividing circuit is urgently needed.

SUMMARY

Embodiments of this application provide a buffer circuit, a frequency dividing circuit, and a communications device, to cancel phase noise generated by the frequency dividing circuit, and improve phase noise performance of an output signal.

According to a first aspect, an embodiment of this application provides a buffer circuit. The buffer circuit includes a buffer, a first control circuit, and a second control circuit. The buffer is coupled to a frequency divider, and the buffer is configured to receive a first signal output by the frequency divider, and when driven by the first signal, perform reverse gain amplification on the input first signal and output a fourth signal by using an output terminal of the buffer circuit. The first control circuit is configured to perform delay control on a rising edge of the fourth signal based on a second signal. The second control circuit is configured to perform delay control on a falling edge of the fourth signal based on a third signal. The first signal is obtained by the frequency divider by performing frequency division on a group of differential signals, the differential signals include the second signal and the third signal, the second signal and the third signal may be square wave signals with a duty ratio of 50%, the rising edge is a level transition edge of transitioning from a low level to a high level, and the falling edge is a level transition edge of transitioning from a high level to a low level.

In this application, the buffer circuit includes the buffer, the first control circuit, and the second control circuit. The buffer performs reverse gain amplification on the frequency-divided first signal and outputs the fourth signal. Further, the first control circuit performs delay control on the rising edge of the fourth signal based on the second signal, and the second control circuit performs delay control on the falling edge of the fourth signal based on the third signal. The second signal and the third signal are signals on which no frequency division is performed, and delay control is performed on the rising edge and the falling edge of the frequency-divided signal respectively by using the second signal and the third signal, to cancel noise generated by the frequency divider. When the second signal and the third signal are square wave signals with a duty ratio of 50%, the first signal and the fourth signal are also square wave signals with a duty ratio of 50%. When the foregoing solution is applied to a Wi-Fi transmitter, a frequency mixer can use the fourth signal with a duty ratio of 50%, to obtain a higher gain and higher linearity.

In a possible design of the first aspect, the buffer may include a first transistor and a second transistor, the first control circuit may include a third transistor, and the second control circuit may include a fourth transistor. The first transistor is connected to the third transistor, and the first transistor and the third transistor may be coupled between the output terminal and a power terminal. The second transistor is connected to the four transistor, and the second transistor and the fourth transistor are coupled between the output terminal and a grounding terminal. Each of the first transistor and the third transistor is a switching transistor that is connected at a low level and disconnected at a high level, and each of the first transistor and the third transistor may be a P-type MOS transistor or a PNP transistor. Each of the second transistor and the fourth transistor is a switching transistor that is disconnected at a low level and connected at a high level, and each of the second transistor and the fourth transistor may be an N-type MOS transistor or an NPN transistor.

In this application, specific implementations of the buffer, the first control circuit, and the third control circuit are provided, to improve feasibility of this solution. In addition, only at least four transistors are used, to implement delay control on the fourth signal, thereby reducing space occupied by the entire buffer circuit.

In a possible design of the first aspect, the first transistor and the second transistor are configured to input the first signal. The third transistor is configured to input the second signal; in each signal period of the first signal, when the first signal transitions from a high level to a low level, the first transistor is connected; and when the second signal transitions from a high level to a low level for the first time, the third transistor is connected, and the output terminal stops outputting a low-level signal and starts to continuously output a high-level signal, to form the rising edge of the fourth signal. The fourth transistor is configured to input the third signal; in each signal period of the first signal, when the first signal transitions from a low level to a high level, the second transistor is connected; and when the third signal transitions from a low level to a high level for the first time, the fourth transistor is connected, and the output terminal stops outputting a high-level signal and starts to continuously output a low-level signal, to form the falling edge of the fourth signal. Each signal period of the first signal may include one complete low-level signal and one complete high-level signal.

In this application, if there is no third transistor, when the first transistor is connected, the output terminal can output the rising edge of the fourth signal. After the third transistor is added, the output terminal can output the rising edge of the fourth signal only when the second signal transitions from a high level to a low level for the first time, to implement delay control on the rising edge of the fourth signal by using the second signal. Correspondingly, if there is no fourth transistor, the falling edge of the fourth signal is formed when the second transistor is connected. After the fourth transistor is added, the output terminal can output the falling edge of the fourth signal only when the third signal transitions from a low level to a high level for the first time, to implement delay control on the falling edge of the fourth signal by using the third signal. The foregoing provides a specific implementation of implementing delay control on the rising edge and the falling edge of the fourth signal by combining the first transistor, the second transistor, the third transistor, and the fourth transistor with the first signal, the second signal, and the third signal, to improve feasibility of this solution.

In a possible design of the first aspect, the frequency divider is a divide-by-N frequency divider, and N is an integer greater than or equal to 2. When N is greater than 2, in each signal period of the first signal, after the first signal transitions from a high level to a low level, and before the first signal transitions from a low level to a high level, the second signal transitions from a high-level signal to a low-level signal at least twice, and when the second signal transitions from a high-level signal to a low-level signal not for the first time, the output terminal continues to output a high-level signal, and no longer forms the rising edge of the fourth signal. After the first signal transitions from a low level to a high level, the third signal transitions from a low-level signal to a high-level signal at least twice, and when the third signal transitions from a low-level signal to a high-level signal not for the first time, the output terminal continues to output a low-level signal, and no longer forms the falling edge of the fourth signal.

In this application, when a value of N in the divide-by-N frequency divider is greater than 2, in a low-level signal period of the first signal, the second signal transitions from a low level to a high level at least twice, and when the second signal transitions from a low level to a high level not for the first time, the output terminal no longer forms the rising edge of the fourth signal. In a high-level signal period of the first signal, the third signal transitions from a high level to a low level at least twice, and when the third signal transitions from a high level to a low level not for the first time, the output terminal no longer forms the falling edge of the fourth signal. A signal output status when the value of N in the divide-by-N frequency divider is greater than 2 is further improved, feasibility of this solution is improved, and it is proved that this solution can be applied to various frequency dividers, to improve comprehensiveness of this solution.

In a possible design of the first aspect, the first signal is included in at least two frequency-divided first signals output by the frequency divider, and the at least two frequency-divided first signals include four frequency-divided first signals. The four frequency-divided first signals include two groups of differential IQ signals, each of the two groups of IQ signals includes one in-phase signal I and one quadrature-phase signal Q, and one group of differential signals includes one positive signal and one negative signal. Signal types of the second signal and the third signal include a positive signal and a negative signal. In a case in which the first signal is an in-phase signal I and a case in which the first signal is a quadrature-phase signal Q, signal types of the second signal are opposite, and signal types of the third signal are opposite. In other words, the signal type of the second signal in the case in which the first signal is an I signal and the signal type of the second signal in the case in which the first signal is a Q signal may be opposite, and the signal type of the third signal in the case in which the first signal is an I signal and the signal type of the third signal in the case in which the first signal is a Q signal may be opposite. Alternatively, in a case in which the first signal is an in-phase signal I and a case in which the first signal is a quadrature-phase signal Q, signal types of the second signal are the same, and signal types of the third signal are the same. In other words, the signal type of the second signal in the case in which the first signal is an I signal and the signal type of the second signal in the case in which the first signal is a Q signal may be the same, and the signal type of the third signal in the case in which the first signal is an I signal and the signal type of the third signal in the case in which the first signal is a Q signal may be the same.

In this application, when the first signal is an I signal in a group of IQ signals and when the first signal is a Q signal in the group of IQ signals, the signal types of the second signal and the third signal may be determined with reference to an actual status, to ensure that a group of IQ signals are still output. Therefore, consistency between a signal relationship between four signals output after processing of the buffer circuit and a signal relationship between four input signals that are received by the buffer circuit and on which no frequency division is performed is ensured, to ensure high availability of the fourth signal.

According to a second aspect, an embodiment of this application provides a buffer circuit. The buffer circuit may include a buffer, a second P-type MOS transistor, and a second N-type MOS transistor. The buffer includes a first P-type MOS transistor and a first N-type MOS transistor, and gates of the first P-type MOS transistor and the first N-type MOS transistor are separately coupled to an input terminal. A source of the first P-type MOS transistor is coupled to a power terminal, a drain of the first P-type MOS transistor is coupled to an output terminal, a source of the first N-type MOS transistor is coupled to a grounding terminal, and a drain of the first N-type MOS transistor is coupled to the output terminal. The second P-type MOS transistor is configured to control connection or disconnection between the output terminal and the power terminal, and the second N-type MOS transistor is configured to control connection or disconnection between the output terminal and the grounding terminal.

In this application, the buffer circuit includes the buffer, the second P-type MOS transistor, and the second N-type MOS transistor, and the buffer includes the first P-type MOS transistor and the first N-type MOS transistor. Because the first P-type MOS transistor and the second P-type MOS transistor are coupled between the output terminal and the power terminal, when low-level signals are input to the first P-type MOS transistor and the second P-type MOS transistor, the output terminal may output a high-level signal. Because the first N-type MOS transistor and the second N-type MOS transistor are coupled between the output terminal and the grounding terminal, when high-level signals are input to the first N-type MOS transistor and the second N-type MOS transistor, the output terminal may output a low-level signal. When a frequency-divided first signal output by a frequency divider is input to the first P-type MOS transistor and the first N-type MOS transistor, an input signal of the second P-type MOS transistor may be adjusted to control connection or disconnection between the output terminal and the power terminal, and an input signal of the second N-type MOS transistor may be adjusted to control connection or disconnection between the output terminal and the grounding terminal, to further perform delay control on a level transition edge of a fourth signal output by the output terminal. When a group of differential signals on which no frequency division is performed are input to the second P-type MOS transistor and a third N-type MOS transistor, the fourth signal output by the output terminal is controlled by the group of differential signals on which no frequency division is performed, to cancel frequency divider noise introduced into the first signal. In a possible design of the second aspect, the buffer is coupled to the frequency divider, and gates of the first P-type MOS transistor and the first N-type MOS transistor are configured to input the first signal. A gate of the second P-type MOS transistor is configured to input a second signal, a source of the second P-type MOS transistor is coupled to the power terminal, and a drain of the second P-type MOS transistor is coupled to the output terminal. A gate of the second N-type MOS transistor is configured to input a third signal, a source of the second N-type MOS transistor is coupled to the grounding terminal, and a drain of the second N-type MOS transistor is coupled to the output terminal. The first signal is any one of at least two frequency-divided first signals obtained by the frequency divider by performing frequency division on a group of differential signals, the differential signals include the second signal and the third signal, and the second signal and the third signal may be square wave signals with a duty ratio of 50%.

In this application, a specific manner of combining the first P-type MOS transistor, the first N-type MOS transistor, the second P-type MOS transistor, and the second N-type MOS transistor with the frequency-divided first signal and the group of differential signals on which no frequency division is performed is provided, to improve feasibility of this solution.

In a possible design of the second aspect, the source of the first P-type MOS transistor is connected to the power terminal, the drain of the first P-type MOS transistor is connected to the source of the second P-type MOS transistor, and the drain of the second P-type MOS transistor is connected to the output terminal. The source of the first N-type MOS transistor is connected to the grounding terminal, the drain of the first N-type MOS transistor is connected to the source of the second N-type MOS transistor, and the drain of the second N-type MOS transistor is connected to the output terminal.

In a possible design of the second aspect, the source of the second P-type MOS transistor is connected to the power terminal, the drain of the second P-type MOS transistor is connected to the source of the first P-type MOS transistor, and the drain of the first P-type MOS transistor is connected to the output terminal. The source of the first N-type MOS transistor is connected to the grounding terminal, the drain of the first N-type MOS transistor is connected to the source of the second N-type MOS transistor, and the drain of the second N-type MOS transistor is connected to the output terminal.

In a possible design of the second aspect, the source of the first P-type MOS transistor is connected to the power terminal, the drain of the first P-type MOS transistor is connected to the source of the second P-type MOS transistor, and the drain of the second P-type MOS transistor is connected to the output terminal. The source of the second N-type MOS transistor is connected to the grounding terminal, the drain of the second N-type MOS transistor is connected to the source of the first N-type MOS transistor, and the drain of the first N-type MOS transistor is connected to the output terminal.

In a possible design of the second aspect, the source of the second P-type MOS transistor is connected to the power terminal, the drain of the second P-type MOS transistor is connected to the source of the first P-type MOS transistor, and the drain of the first P-type MOS transistor is connected to the output terminal. The source of the second N-type MOS transistor is connected to the grounding terminal, the drain of the second N-type MOS transistor is connected to the source of the first N-type MOS transistor, and the drain of the first N-type MOS transistor is connected to the output terminal.

In a possible design of the second aspect, the buffer circuit may further include a phase inverter. The phase inverter is coupled to the output terminal. After the signal output by the output terminal passes through the phase inverter, a phase is inverted, in other words, a high-level signal is inverted into a low-level signal, or a low-level signal is inverted into a high-level signal.

In this application, the output terminal is coupled to the phase inverter, to provide a sufficiently strong drive capability for the fourth signal. In addition, a structure of the phase inverter is simple, so that a connection is easy, to improve feasibility of this solution.

For specific implementations and beneficial effects of other possible designs of the second aspect of this application, refer to the first aspect. Details are not described herein again.

According to a third aspect, an embodiment of this application provides a buffer circuit, including a buffer, a second PNP transistor, and a second NPN transistor. The buffer includes a first PNP transistor and a first NPN transistor. Bases of the first PNP transistor and the first NPN transistor are separately coupled to an input terminal, an emitter of the first PNP transistor is coupled to a power terminal, a collector of the first PNP transistor is coupled to an output terminal, an emitter of the first NPN transistor is coupled to a grounding terminal, and a collector of the first NPN transistor is coupled to the output terminal. The second PNP transistor is configured to control connection or disconnection between the output terminal and the power terminal, and the second NPN transistor is configured to control connection or disconnection between the output terminal and the grounding terminal.

Specific implementations and beneficial effects of the third aspect and various possible designs of this application are similar to those of the second aspect, and a difference lies only in that the first P-type MOS transistor and the first N-type MOS transistor are replaced with the first PNP transistor and the first NPN transistor, and the second P-type MOS transistor and the second N-type MOS transistor are replaced with the second PNP transistor and the second NPN transistor. Details are not described herein again.

According to a fourth aspect, an embodiment of this application provides a frequency dividing circuit. The frequency dividing circuit may include a frequency divider and at least two buffer circuits. The frequency divider is configured to perform frequency division on a group of differential signals to obtain at least two frequency-divided first signals. The group of differential signals includes a second signal and a third signal, the frequency divider includes at least two output terminals, each of the at least two output terminals is configured to output one first signal, and each of the at least two buffer circuits is coupled to one of the at least two output terminals. Each of the at least two buffer circuits is the buffer circuit described in the first aspect, the second aspect, or the third aspect.

In this application, the frequency dividing circuit includes the buffer circuits and the frequency divider. The buffer circuit performs reverse gain amplification on the first signal output by the frequency divider, and performs delay control on a rising edge and a falling edge of a frequency-divided signal respectively by using the second signal and the third signal, to cancel noise generated by the frequency divider. When the second signal and the third signal are square wave signals with a duty ratio of 50%, the first signal and a fourth signal are also square wave signals with a duty ratio of 50%. When the foregoing solution is applied to a Wi-Fi transmitter, a frequency mixer can use the fourth signal with a duty ratio of 50%, to obtain a higher gain and higher linearity.

According to a fifth aspect, an embodiment of this application provides a communications device. The communications device includes a frequency divider, the buffer circuits described in the first aspect, the second aspect, or the third aspect, and frequency mixers. A frequency dividing circuit is configured to input a frequency-divided first signal output by the frequency divider, and output a local-frequency signal. The frequency mixer is configured to perform down-conversion on an input radio frequency signal by using the local-frequency signal, or the frequency mixer is configured to perform up-conversion on an input radio frequency signal by using the local-frequency signal.

In this application, the communications device includes the frequency dividing circuit and the frequency mixers, the frequency dividing circuit includes the buffer circuits and the frequency divider. The buffer circuit performs delay control on a rising edge and a falling edge of a frequency-divided fourth signal by using a second signal and a third signal on which no frequency division is performed, to cancel noise introduced by the frequency divider, and improve noise performance of the frequency-divided signal. When the second signal and the third signal are square wave signals with a duty ratio of 50%, the fourth signal is also a square wave signal with a duty ratio of 50%. Then, the frequency mixer can use the fourth signal with a duty ratio of 50%, to obtain a higher gain and higher linearity.

For specific implementations and beneficial effects of other possible designs of the fourth aspect and the fifth aspect of this application, refer to the second aspect and the third aspect. Details are not described herein again.

According to a sixth aspect, an embodiment of this application provides a signal processing method. The method is applied to a buffer circuit, the buffer circuit is coupled to a frequency divider, the frequency divider is configured to perform frequency division on a group of differential signals to obtain at least two frequency-divided first signals, and the group of differential signals includes a second signal and a third signal. The method may include: inputting the first signal, the second signal, and the third signal; in one signal period of the first signal, after the first signal transitions from a high level to a low level, when the second signal transitions from a high level to a low level for the first time, stopping, by an output terminal of the buffer circuit, outputting a low-level signal and starting to continuously output a high-level signal to form a rising edge of a fourth signal, to implement delay control on the rising edge of the fourth signal, where the fourth signal is a signal output by the output terminal; and after the first signal transitions from a low level to a high level, when the third signal transitions from a low level to a high level for the first time, stopping, by the output terminal of the buffer circuit, outputting a high-level signal and starting to continuously output a low-level signal to form a falling edge of the fourth signal, to implement delay control on the falling edge of the fourth signal, where one signal period of the first signal includes one complete high-level signal and one complete low-level signal.

In this application, delay control is performed on the rising edge and the falling edge of the frequency-divided fourth signal by using the second signal and the third signal on which no frequency division is performed, to cancel frequency divider noise introduced into the frequency-divided fourth signal.

In a possible design of the sixth aspect, the buffer circuit may further include a phase inverter. The phase inverter is coupled to the output terminal, and is configured to invert the input fourth signal. After the stopping, by an output terminal of the buffer circuit, outputting a low-level signal and starting to continuously output a high-level signal, the method may further include: stopping, by the phase inverter, outputting a high-level signal and starting to continuously output a low-level signal, to invert the rising edge of the fourth signal to form the falling edge of the fourth signal. After the stopping, by the output terminal of the buffer circuit, outputting a high-level signal and starting to continuously output a low-level signal, the method further includes: stopping, by the phase inverter, outputting the low-level signal and starting to continuously output a high-level signal, to invert the falling edge of the fourth signal to form the rising edge of the fourth signal.

In this application, the output terminal may be further coupled to the phase inverter, to provide a sufficiently strong drive capability for the fourth signal. In addition, a structure of the phase inverter is simple, so that a connection is easy, to improve feasibility of this solution.

DESCRIPTION OF EMBODIMENTS

Figure 1:
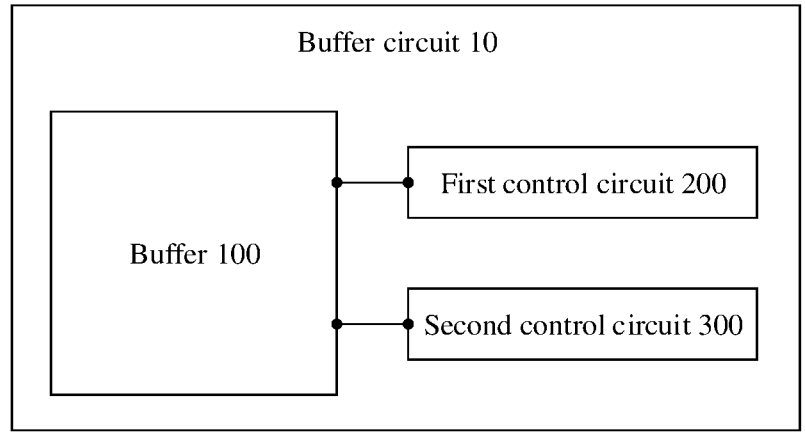
FIG. 1 is a schematic structural diagram of a buffer circuit according to an embodiment of this application.

Embodiments of this application provide a buffer circuit, a frequency dividing circuit, a communications device, and a signal processing method, to cancel phase noise generated by the frequency dividing circuit, and improve phase noise performance of an output signal.

In the specification, claims, and accompanying drawings of this application, the terms "first", "second", and so on are intended to distinguish between similar objects but do not necessarily indicate a specific order or sequence. It should be understood that the terms used in such a way are interchangeable in proper circumstances. This is merely a distinguishing manner that is used when objects having a same attribute are described in the embodiments of this application. In addition, the terms "include", "contain" and any other variants mean to cover the non-exclusive inclusion, so that a process, method, system, product, or device that includes a series of units is not necessarily limited to those units, but may include other units not expressly listed or inherent to such a process, method, product, or device.

The technical solutions provided in the embodiments of this application may be applied to various data processing communications systems, for example, code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" can be exchanged with each other. The CDMA system may implement radio technologies such as universal terrestrial radio access (UTRA) and CDMA1000. The UTRA may include a wideband CDMA (WCDMA) technology and other variant technologies of the CDMA. The CDMA1000 may cover an interim standard (IS) 1000 (IS-1000), IS-95, and an IS-856 standard. The TDMA system may implement a radio technology such as global system for mobile communications (GSM). The OFDMA system may implement radio technologies such as evolved universal terrestrial radio access (E-UTRA), ultra mobile broadband (UMB), IEEE 802.11 (Wi-Fi), IEEE 802.16 (WiMAX), IEEE 802.10, and Flash OFDMA. The UTRA and E-UTRA are UMTS and an evolved version of the UMTS. A new version of the UMTS, namely, the E-UTRA is used for 3GPP in long term evolution (long term evolution, LTE) and various LTE-based evolved versions. A fifth generation ("5G" for short) communications system and new radio ("NR" for short) are next-generation communications systems under research. In addition, the communications system can be further applied to a future-oriented communications technology to which the technical solutions provided in the embodiments of this application are applicable. The system architecture and the service scenario described in the embodiments of this application are intended to describe the technical solutions in the embodiments of this application more clearly, and do not constitute a limitation on the technical solutions provided in the embodiments of this application. A person of ordinary skill in the art may know that: With the evolution of the network architecture and the emergence of new service scenarios, the technical solutions provided in the embodiments of this application are also applicable to similar technical problems.

In the embodiments of this application, the communications system includes a plurality of communications devices. Specifically, the communications device may be any device with wireless sending and receiving functions. Both the buffer circuit and the frequency dividing circuit provided in the embodiments of this application may be applied to the foregoing communications device. Specifically, the buffer circuit used in the frequency dividing circuit may exist in a frequency dividing circuit of the foregoing communications device.

More specifically, the communications device includes but is not limited to a base station (for example, a base station BS, a base station NodeB, an evolved base station eNodeB or eNB, a base station gNodeB or gNB in a fifth generation 5G communications system, a base station in a future communications system, an access node in a Wi-Fi system, a wireless relay node, or a wireless backhaul node) or a terminal device.

The base station may be a macro base station, a micro base station, a pico base station, a small cell, a relay station, or the like. A plurality of base stations may support a network of one or more technologies mentioned above, or a future evolved network. A core network may support a network of one or more technologies mentioned above, or a future evolved network. The base station may include one or more co-sited or non-co-sited transmission/reception points (TRP). Alternatively, the communications device may be a radio controller, a centralized unit (CU), a distributed unit (DU), or the like in a cloud radio access network (CRAN) scenario. Alternatively, the communications device may be a server, a wearable device, a vehicle-mounted device, or the like.

The terminal device is alternatively referred to as user equipment (UE), a mobile station (MS), a mobile terminal (MT), a terminal, or the like, and is a device that provides voice and/or data connectivity for a user, or a chip disposed in the device, for example, a hand-held device or a vehicle-mounted device with a wireless connection function. Currently, examples of some terminal devices are: a mobile phone, a tablet computer, a notebook computer, a palmtop computer, a mobile internet device (MID), a wearable device, a virtual reality (VR) device, an augmented reality (AR) device, a wireless terminal in industrial control, a wireless terminal in self driving, a wireless terminal in remote medical surgery, a wireless terminal in smart grid, a wireless terminal in transportation safety, a wireless terminal in smart city, and a wireless terminal in smart home.

The following describes the embodiments of this application with reference to accompanying drawings.

Figure 2:
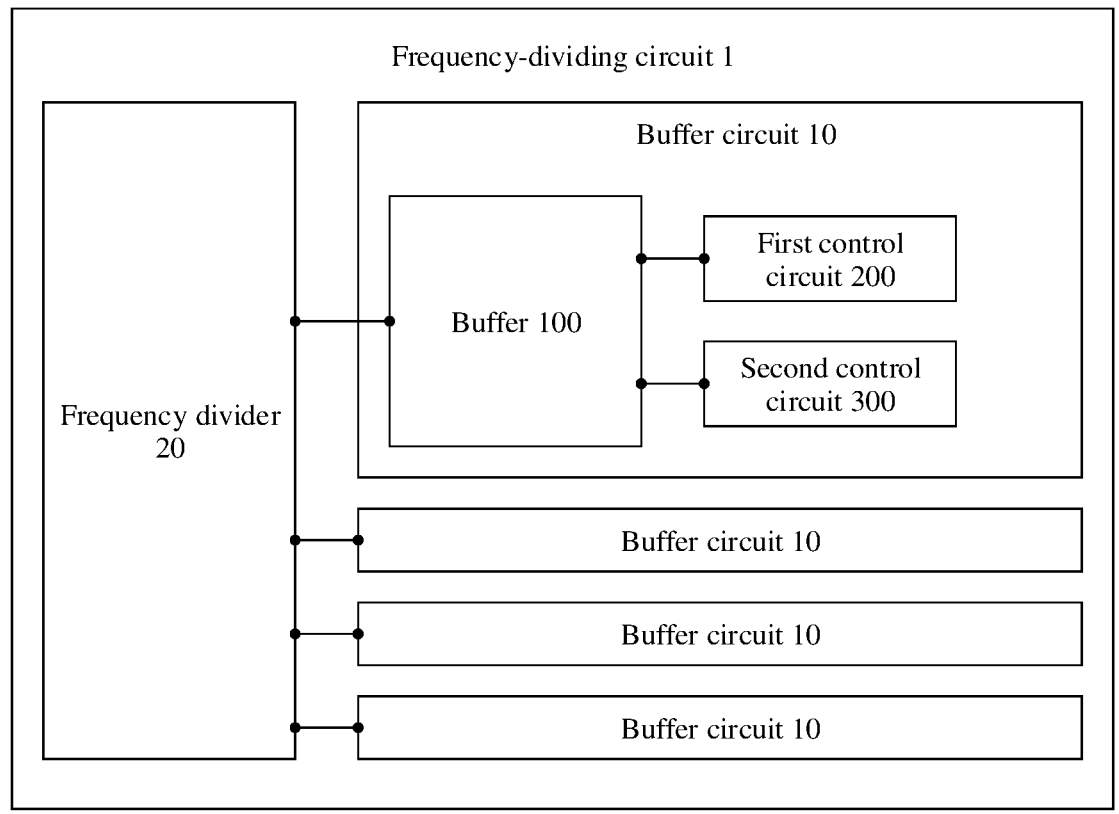
FIG. 2 is a schematic structural diagram of a frequency dividing circuit according to an embodiment of this application.

FIG. 1 is a schematic structural diagram of a buffer circuit according to an embodiment of this application, and FIG. 2 is a schematic structural diagram of a frequency dividing circuit 1 according to an embodiment of this application.

The buffer circuit 10 provided in this embodiment of this application may be applied to the frequency dividing circuit 1. The frequency dividing circuit 1 further includes a frequency divider 20. The buffer circuit 10 is coupled to the frequency divider 20.

Specifically, referring to FIG. 1, the buffer circuit 10 may include a buffer 100, a first control circuit 200, and a second control circuit 300. The buffer 100 is configured to output a fourth signal by using an output terminal of the buffer circuit 10 when driven by an input first signal. Specifically, the buffer 100 performs reverse gain amplification on the input first signal, and outputs the fourth signal. The first control circuit 200 is configured to perform delay control on a rising edge of the fourth signal based on a second signal. The second control circuit 300 is configured to perform delay control on a falling edge of the fourth signal based on a third signal. The first signal is obtained by the frequency divider 20 by performing frequency division on a group of differential signals, the differential signals includes the second signal and the third signal, and the fourth signal is a signal output by the output terminal of the buffer circuit 10.

In this embodiment of this application, each signal period of the first signal includes one complete high-level signal and one complete low-level signal. After performing frequency division on the input second signal and third signal, the frequency divider 20 may obtain at least two frequency-divided first signals. In other words, to obtain the first signals, the frequency divider needs to perform a frequency dividing operation for a plurality of times. Because crossover points of the frequency dividing operations performed by the frequency divider may be inconsistent, the first signals are not completely the same in different signal periods, and as a result, noise of the frequency divider is introduced into the frequency-divided first signals.

The at least two frequency-divided first signals may be obtained after the frequency dividing circuit performs the frequency dividing operation on the second signal and the third signal. Specifically, two frequency-divided first signals, or four frequency-divided first signals, or another quantity of frequency-divided signals may be obtained.

More specifically, the second signal and the third signal may be square wave signals with a duty ratio of 50%. It can be learned with reference to the foregoing description of an application environment of this solution that the buffer circuit 10 provided in this embodiment of this application may be applied to various types of communications devices. When the buffer circuit 10 is applied to different communications devices, signal types of the first signal, the second signal, and the third signal may be different provided that the second signal and the third signal are signals on which frequency division is to be performed and the first signal is a frequency-divided signal. It should be understood that in this embodiment and a subsequent embodiment, description is provided merely by using an example in which all of the first signal, the second signal, and the third signal are clock signals.

In this embodiment of this application, to cancel the noise introduced by the frequency divider, the first control circuit 200 and the second control circuit 300 are disposed in the buffer circuit 10 of this application. The first control circuit 200 and the second control circuit 300 are separately coupled to the buffer 100. The first control circuit 200 performs delay control on the rising edge of the fourth signal based on the second signal. In other words, the first control circuit 200 adjusts a location of the rising edge of the fourth signal based on the second signal, so that a time of generating the rising edge of the fourth signal is delayed. The second control circuit 300 adjusts a location of the falling edge of the fourth signal based on the third signal, so that a time of generating the falling edge of the fourth signal is delayed.

The rising edge is a level transition edge of transitioning from a low level to a high level, and the falling edge is a level transition edge of transitioning from a high level to a low level.

In this embodiment of this application, the buffer circuit 10 includes the buffer 100, the first control circuit 200, and the second control circuit 300. The buffer 100 performs reverse gain amplification on the frequency-divided first signal, and outputs the fourth signal. Further, the first control circuit 200 performs delay control on the rising edge of the fourth signal based on the second signal, and the second control circuit 300 performs delay control on the falling edge of the fourth signal based on the third signal. The second signal and the third signal are signals on which no frequency division is performed, and delay control is performed on the rising edge and the falling edge of the frequency-divided signal by using the second signal and the third signal, to cancel noise generated by the frequency divider. When the second signal and the third signal are square wave signals with a duty ratio of 50%, the first signal and the fourth signal are also square wave signals with a duty ratio of 50%. When the foregoing solution is applied to a Wi-Fi transmitter, a frequency mixer can use the fourth signal with a duty ratio of 50%, to obtain a higher gain and higher linearity.

Figure 3:
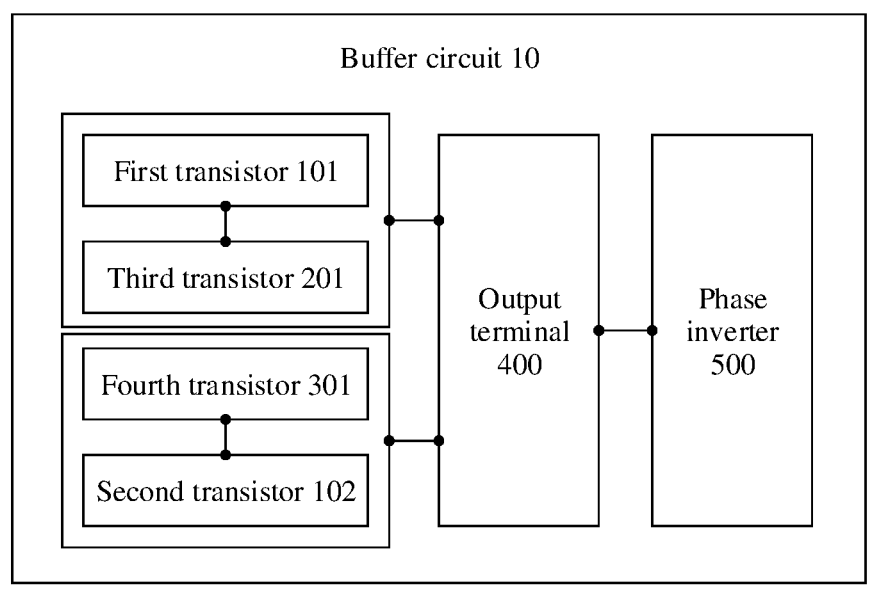
FIG. 3 is another schematic structural diagram of a buffer circuit according to an embodiment of this application.

Specifically, referring to FIG. 3, the buffer circuit 10 may further include the output terminal 400. The buffer 100 includes a first transistor 101 and a second transistor 102, configured to perform gain amplification on the input first signal. The first control circuit 200 includes a third transistor 201, and the second control circuit 300 includes a fourth transistor 301. The first transistor 101 is connected to the third transistor 201, and the first transistor 101 and the third transistor 201 are coupled between the output terminal and a power terminal. The second transistor 102 is connected to the fourth transistor 301, and the second transistor 102 and the fourth transistor 301 are coupled between the output terminal and a grounding terminal. Each of the first transistor 101 and the third transistor 201 may be a switching transistor that is connected at a low level and disconnected at a high level, and each of the second transistor 102 and the fourth transistor 301 may be a switching transistor that is disconnected at a low level and connected at a high level. Specific implementations of the buffer 100, the first control circuit 200, and the second control circuit 300 are provided, to improve feasibility of this solution. In addition, only at least four transistors are used, to implement delay control on the fourth signal, thereby reducing space occupied by the entire buffer circuit 10.

In this embodiment of this application, each of the first transistor 101, the second transistor 102, the third transistor 201, and the fourth transistor 301 may be implemented by using a metal oxide semiconductor (metal oxide semiconductor, MOS) field effect transistor (briefly referred to as "MOS transistor"), or may be implemented by using a triode, or may be implemented by using a transistor of another type provided that each of the first transistor 101 and the third transistor 201 is connected when the input signal is a low-level signal and is disconnected when the input signal is a high-level signal, and each of the second transistor 102 and the fourth transistor 301 is disconnected when the input signal is a low-level signal and is connected when the input signal is a high-level signal. This is not limited herein. In an example, when all of the transistors are represented as MOS transistors, the first transistor 101 and the third transistor 201 may be specifically represented as P-type MOS transistors, and the second transistor 102 and the fourth transistor 301 may be specifically represented as N-type MOS transistors. The P-type MOS transistor is a positive MOS transistor, and the N-type MOS transistor is a negative MOS transistor. In another example, when all of the transistors are represented as triodes, the first transistor 101 and the third transistor 201 may be specifically represented as PNP transistors, and the second transistor 102 and the fourth transistor 301 may be specifically represented as NPN transistors. It should be understood that the foregoing example is merely used to prove feasibility of this solution. Determining of specific implementations of the first transistor 101, the second transistor 102, the third transistor 201, and the fourth transistor 301 is not limited herein.

Specifically, the first transistor 101 and the second transistor 102 are configured to input the first signal. The third transistor 201 is configured to input the second signal; in each signal period of the first signal, after the first signal transitions from a high level to a low level, the first transistor 101 is connected; and when the second signal transitions from a high level to a low level for the first time, the third transistor 201 is connected, and the output terminal 400 stops outputting a low-level signal and starts to continuously output a high-level signal, to form the rising edge of the fourth signal. The fourth transistor 301 is configured to input the third signal; in each signal period of the first signal, after the first signal transitions from a low level to a high level, the second transistor 102 is connected; and when the third signal transitions from a low level to a high level for the first time, the fourth transistor 301 is connected, and the output terminal 400 stops outputting a high-level signal and starts to continuously output a low-level signal, to form the falling edge of the fourth signal.

More specifically, in one signal period of the first signal, after the first signal transitions from a high-level signal to a low-level signal, when the second signal transitions from a high-level signal to a low-level signal for the first time, the output terminal 400 stops outputting a low-level signal and starts to continuously output a high-level signal, to form the rising edge of the fourth signal. If the third transistor 201 does not exist, the rising edge of the fourth signal is formed when the first transistor 101 is connected. Therefore, after the third transistor 201 is added, delay control on the rising edge of the fourth signal is implemented. The output terminal 400 starts to continuously output a high-level signal. After the first signal transitions from a low-level signal to a high-level signal again, when the third signal transitions from a low-level signal to a high-level signal for the first time, the output terminal 400 stops outputting a high-level signal and starts to continuously output a low-level signal, to form the falling edge of the fourth signal. If the fourth transistor 301 does not exist, the falling edge of the fourth signal is formed when the second transistor 102 is connected. Therefore, after the fourth transistor 301 is added, delay control on the falling edge of the fourth signal is implemented. Because a signal output status in each signal period of the first signal is the same as that described above, the following is implemented: in each signal period of the first signal, delay control is performed on the locations of the transition edges of the output signal by using the second signal and the third signal, so that the locations of the transition edges of the output signal are aligned with edges of the second signal and the third signal, and phase noise generated by the frequency dividing circuit is cancelled. In addition, because the output signal is controlled to form the transition edges only when the second signal and the third signal meet edge transition conditions for the first time, a quantity of times of edge transition of the output signal in one signal period is still consistent with that of the first signal.

In this embodiment of this application, a quantity of first transistors 101 may be one or at least two, and signal inputs, transistor types, and signal output manners of the at least two transistors are the same. Correspondingly, a quantity of the second transistors 102, the third transistors 201, or the fourth transistors 301 may be one or at least two.

In this embodiment of this application, a specific implementation of implementing delay control on the rising edge and the falling edge of the fourth signal by combining the first transistor 101, the second transistor 102, the third transistor 201, and the fourth transistor 301 with the first signal, the second signal, and the third signal is provided, to improve feasibility of this solution.

Referring to FIG. 3, each buffer circuit 10 may further include at least one phase inverter 500. The phase inverter 500 is coupled to the output terminal 400. After the signal output by the output terminal 400 passes through the phase inverter 500, a phase is inverted, in other words, a high-level signal is inverted into a low-level signal, or a low-level signal is inverted into a high-level signal.

Specifically, each buffer circuit 10 may include one phase inverter 500 or at least two phase inverters 500, and each of the four buffer circuits 10 includes a same quantity of phase inverters 500. If each buffer circuit 10 includes one phase inverter 500, the phase inverter 500 is directly coupled to the output terminal 400. If each buffer circuit 10 includes at least two phase inverters 500, the at least two inverters 500 are connected in series and then are coupled to the output terminal 400. The output terminal 400 is coupled to the phase inverter 500, to provide a sufficiently strong drive capability for the signal output by the buffer circuit 10. In addition, a structure of the phase inverter 500 is simple, so that a connection is easy, to improve feasibility of this solution.

Figure 4:
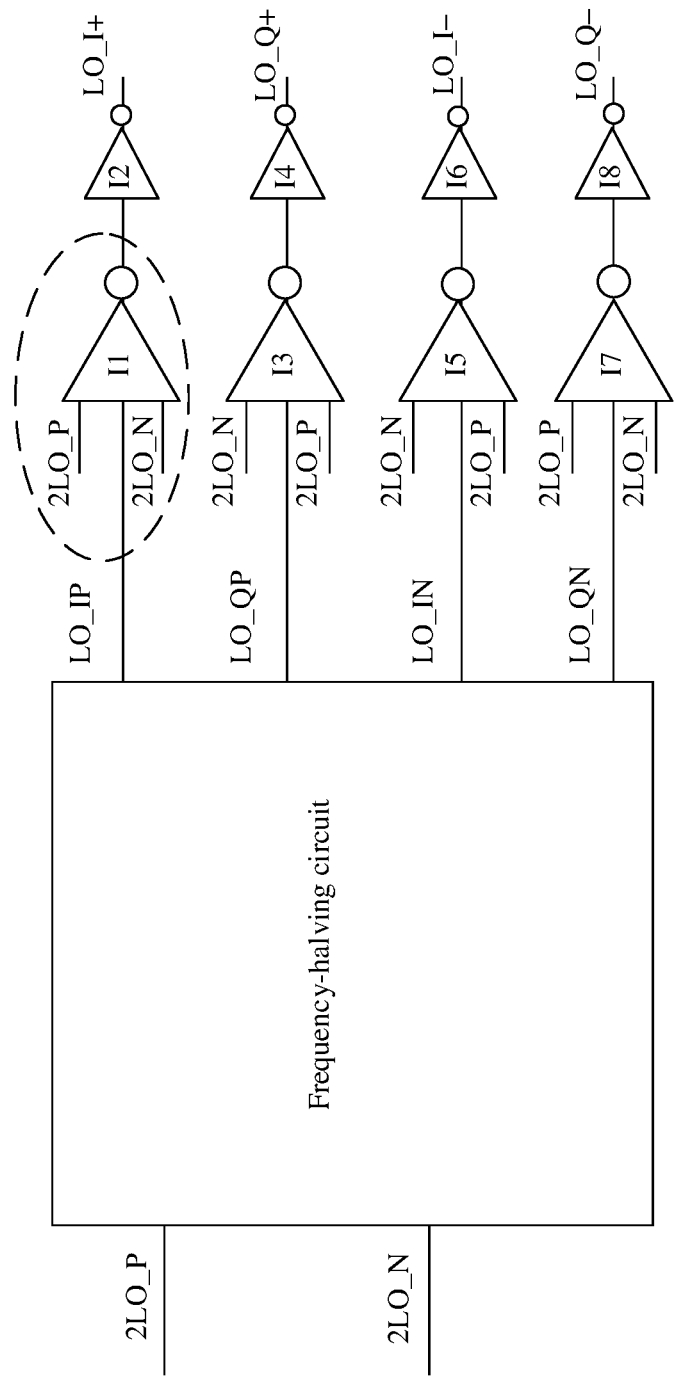
FIG. 4 is another schematic structural diagram of a frequency dividing circuit according to an embodiment of this application.
Figure 5:
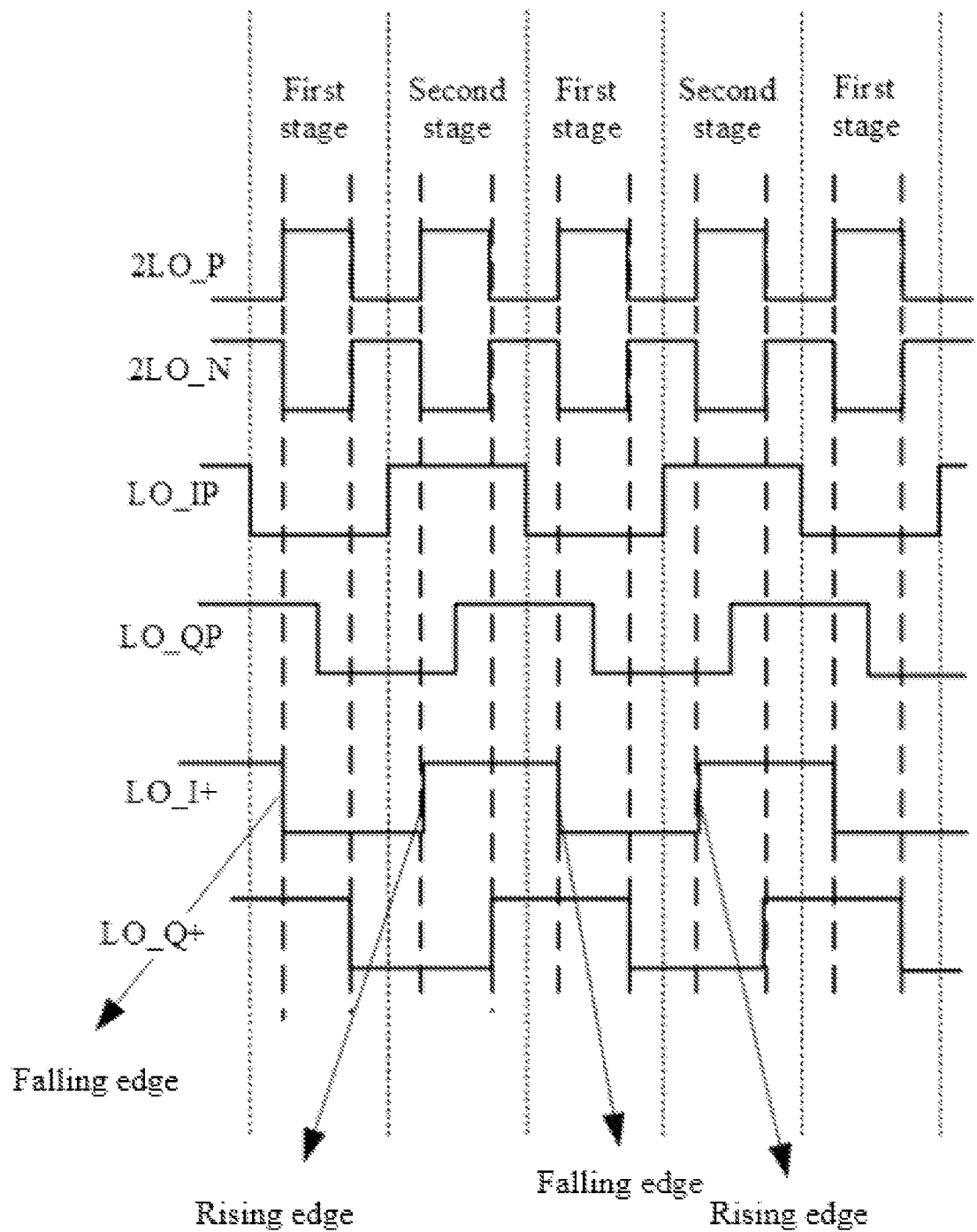
FIG. 5 is a waveform diagram of various signals when a frequency dividing circuit is a frequency-halving circuit according to an embodiment of this application.
Figure 11:
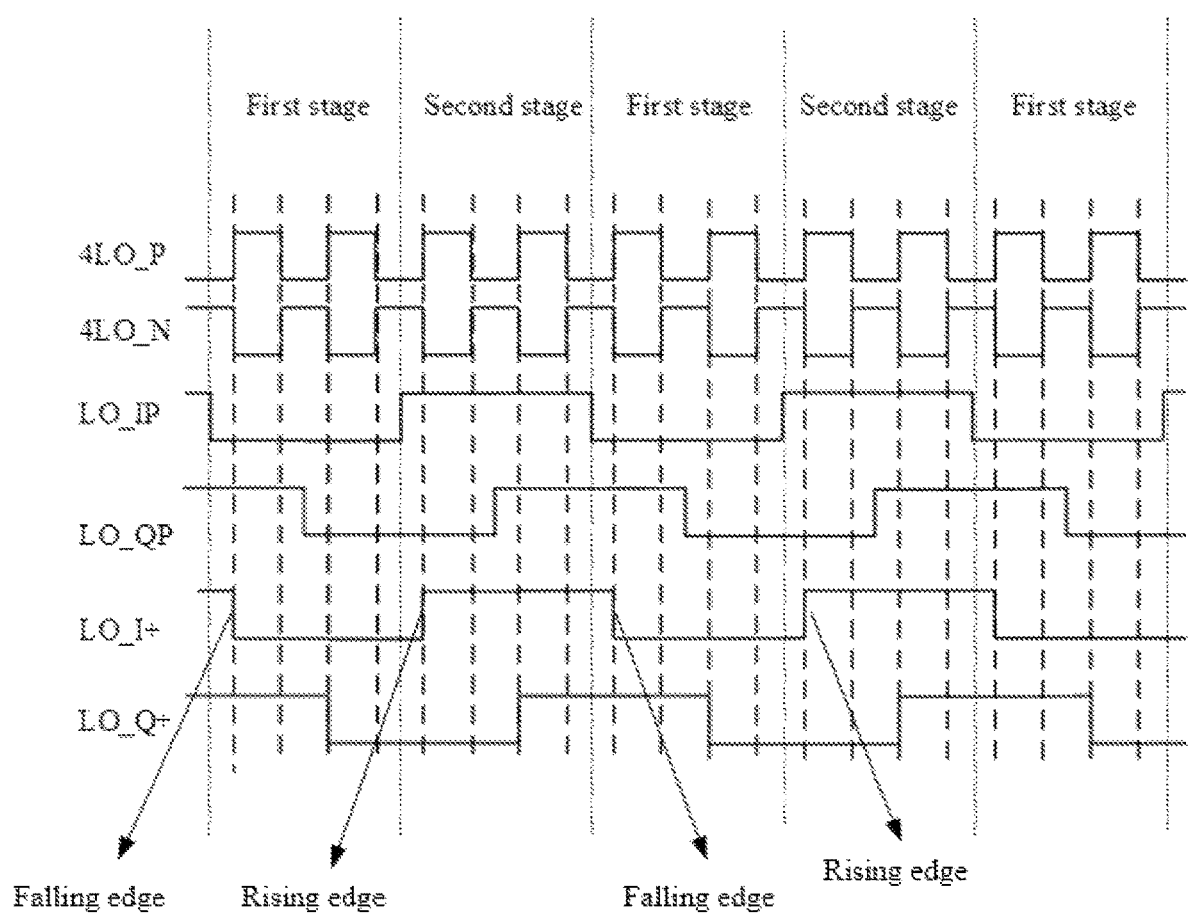
FIG. 11 is a waveform diagram of various signals when a frequency dividing circuit is a divide-by-four frequency dividing circuit according to an embodiment of this application.

In this embodiment of this application, the second signal and the third signal form a group of differential signals. A group of differential signals includes one positive signal and one negative signal, and for the positive signal and the negative signal, amplitudes are equal, a difference between phases is 180 degrees, and polarities are opposite. FIG. 5 is a schematic waveform diagram of various signals when the frequency dividing circuit is a frequency-halving circuit, and FIG. 11 is a schematic waveform diagram of various signals when the frequency dividing circuit is a divide-by-four frequency dividing circuit. 2LO_P in FIGS. 5 and 4LO_P in FIG. 11 are positive signals, and 2LO_N in FIGS. 5 and 4LO_N in FIG. 11 are negative signals. However, it should be understood that dividing a group of differential signals into a positive signal and a negative signal and providing an example herein are merely for ease of understanding of this solution, and specific representation forms of the differential signals are not limited.

In this embodiment of this application, when the frequency divider 20 outputs four frequency-divided first signals, the four frequency-divided first signals may include two groups of differential IQ signals, and each group of IQ signals includes one I signal and one Q signal. The first signal is any one of the four frequency-divided signals that are obtained after a frequency dividing operation is performed on the second signal and the third signal. Because the second signal and the third signal (the signals on which no frequency division is performed) are square wave signals with a duty ratio of 50%, the frequency-divided first signal is also a square wave signal with a duty ratio of 50%. In an example, referring to FIG. 5, LO_IP and LO_QP in FIG. 5 are a group of IQ signals obtained after the 2LO_P is processed by the frequency-halving circuit. In another example, referring to FIG. 11, LO_IP and LO_QP in FIG. 11 are a group of IQ signals obtained after the 4LO_P is processed by the divide-by-four frequency dividing circuit. The LO_IP is an I signal, and the LO_QP is a Q signal. It should be understood that dividing the foregoing one group of IQ signals into an I signal and a Q signal and providing examples of specific waveforms of the I signal and the Q signal are merely for ease of understanding in this solution, and specific representation forms of the second signal and the third signal are not limited herein.

In this embodiment of this application, in a case in which the first signal is an I signal and a case in which the first signal is a Q signal, a phase difference of the signal is 90 degrees. Therefore, after passing through the buffer circuits 10, the output signals may also form a group of IQ signals. Types of the second signal and the third signal may be determined with reference to a waveform diagram of the first signal. Signal types of the second signal and the third signal may include a positive signal and a negative signal.

In some embodiments of this application, in the case in which the first signal is an I signal and the case in which the first signal is a Q signal, signal types of the second signal may be opposite, and in the case in which the first signal is an I signal and the case in which the first signal is a Q signal, signal types of the third signal may also be opposite. In other words, the signal type of the second signal in the case in which the first signal is an I signal and the signal type of the second signal in the case in which the first signal is a Q signal may be opposite, and the signal type of the third signal in the case in which the first signal is an I signal and the signal type of the third signal in the case in which the first signal is a Q signal may be opposite. Specifically, when the first signal is an in-phase signal I, the second signal is a negative signal, and the third signal is a positive signal, or when the first signal is a quadrature-phase signal Q, the second signal is a positive signal, and the third signal is a negative signal. Alternatively, when the first signal is an in-phase signal I, the second signal is a positive signal, and the third signal is a negative signal, or when the first signal is a quadrature-phase signal Q, the second signal is a negative signal, and the third signal is a positive signal.

In some embodiments of this application, in the case in which the first signal is an I signal and the case in which the first signal is a Q signal, signal types of the second signal may be the same, and in the case in which the first signal is an I signal and the case in which the first signal is a Q signal, signal types of the third signal may also be the same. In other words, the signal type of the second signal in the case in which the first signal is an I signal and the signal type of the second signal in the case in which the first signal is a Q signal may be the same, and the signal type of the third signal in the case in which the first signal is an I signal and the signal type of the third signal in the case in which the first signal is a Q signal may be the same. Specifically, when the first signal is an in-phase signal I or a quadrature-phase signal Q, the second signal is a negative signal, and the third signal is a positive signal. Alternatively, when the first signal is an in-phase signal I or a quadrature-phase signal Q, the second signal is a positive signal, and the third signal is a negative signal.

In this embodiment of this application, when the first signal is an I signal or a Q signal in a group of IQ signals, the signal types of the second signal and the third signal may be determined with reference to an actual status, to ensure that a group of IQ signals are still output. Therefore, consistency between a signal relationship between the four signals output after processing of the buffer circuits 10 and a signal relationship between the four input signals that are received by the buffer circuits 10 and on which no frequency division is performed is ensured, to ensure availability of the signal output by the buffer circuit 10.

Figure 6:
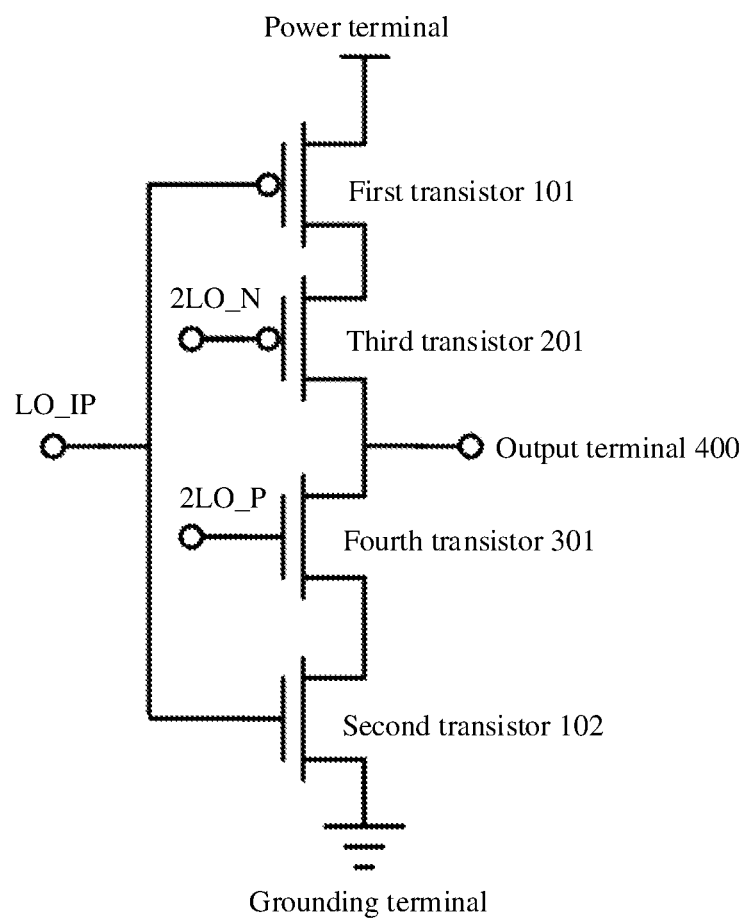
FIG. 6 is still another schematic structural diagram of a buffer circuit according to an embodiment of this application.
Figure 7:
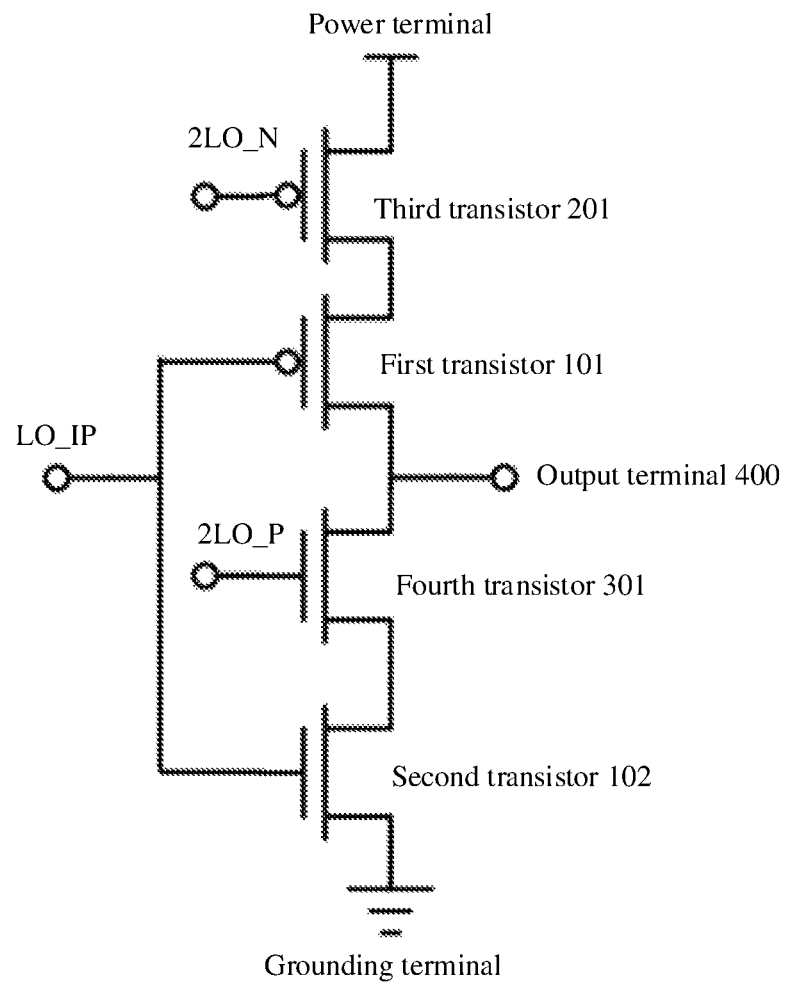
FIG. 7 is yet another schematic structural diagram of a buffer circuit according to an embodiment of this application.
Figure 8:
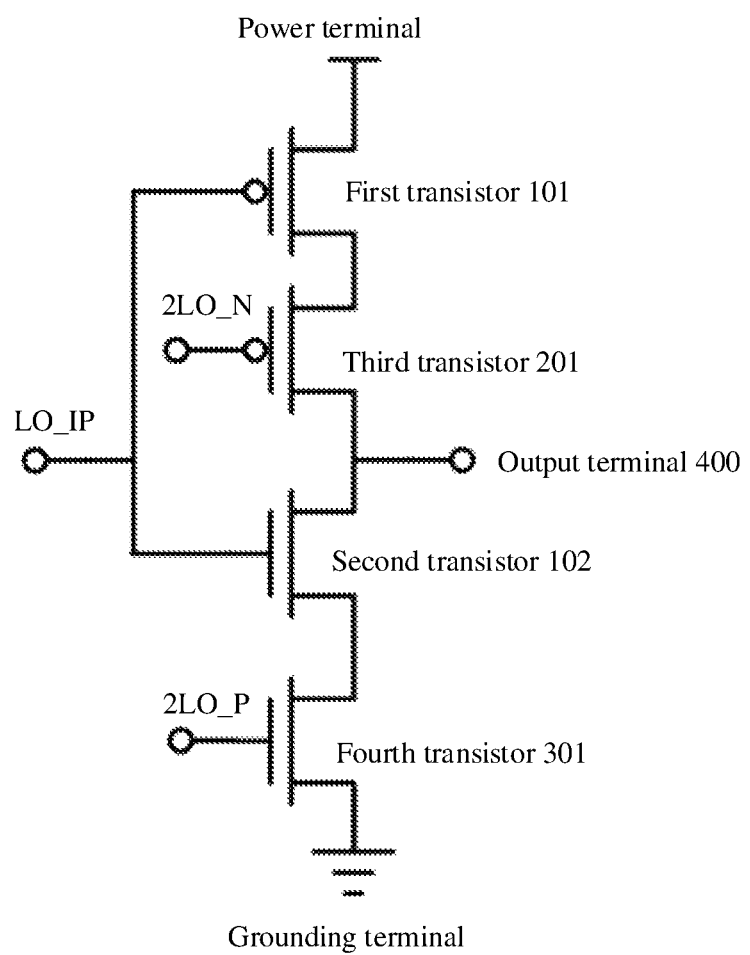
FIG. 8 is still yet another schematic structural diagram of a buffer circuit according to an embodiment of this application.
Figure 9:
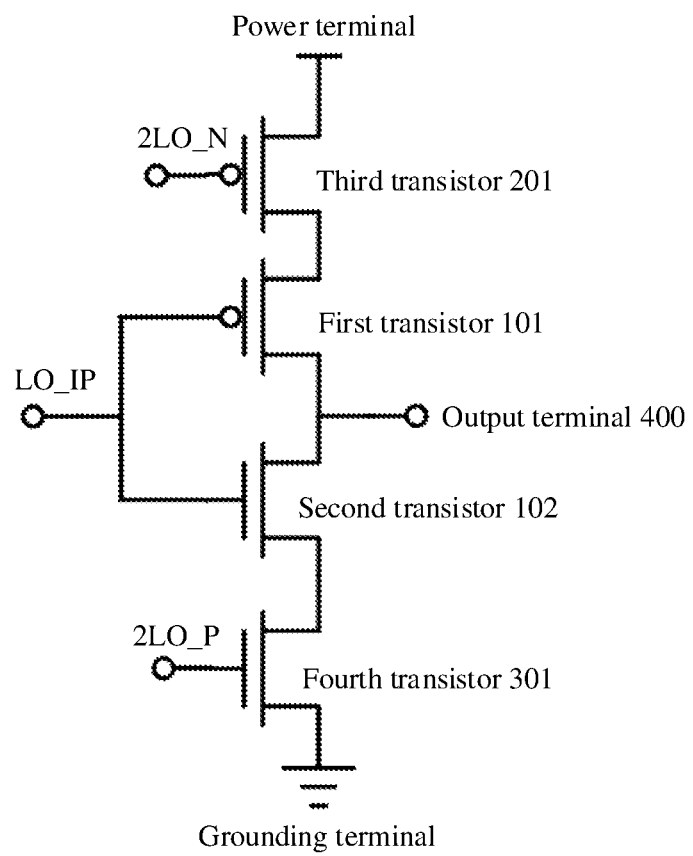
FIG. 9 is a further schematic structural diagram of a buffer circuit according to an embodiment of this application.

In this embodiment of this application, the output terminal 400 may be connected to two transistors. Specifically, FIG. 6 to FIG. 9 are respectively four schematic diagrams of connections between the output terminal 400 and the transistors. Referring to FIG. 6, the output terminal 400 may be connected to the third transistor 201 and the fourth transistor 301. Referring to FIG. 7, the output terminal 400 may be connected to the first transistor 101 and the fourth transistor 301. Referring to FIG. 8, the output terminal 400 may be connected to the third transistor 201 and the second transistor 102. Referring to FIG. 9, the output terminal 400 may be connected to the first transistor 101 and the second transistor 102.

In this embodiment of this application, the frequency divider 20 may be a divide-by-N frequency divider, and N is an integer greater than or equal to 2. Specifically, the frequency divider 20 includes but is not limited to a divide-by-two frequency divider, a divide-by-three frequency divider, a divide-by-four frequency divider, a divide-by-five frequency divider, a divide-by-six frequency divider, a divide-by-seven frequency divider, or a divide-by-eight frequency divider. The technical solutions provided in the embodiments of this application may be applied to a plurality of frequency dividers, so that application scenarios of the buffer circuit in this application are wide, and comprehensiveness of this solution is improved. However, when values of N are different, signal types of the specifically input second signal and third signal may be different. The frequency dividing circuit 1 provided in this embodiment of this application is further explained and described with reference to FIG. 4 to FIG. 12 and by using an example in which the frequency divider 20 is a divide-by-two frequency divider and an example in which the frequency divider 20 is a divide-by-four frequency divider. It should be understood that the examples are used herein merely for ease of understanding this solution, and are not intended to limit determining of a frequency dividing coefficient of the frequency divider 20 in a specific product.

First, a case in which the frequency divider 20 is a divide-by-two frequency divider is described with reference to the accompanying drawings. Referring to FIG. 4 and FIG. 5, FIG. 4 is a schematic structural diagram of the frequency dividing circuit 1 according to an embodiment of this application. Referring to FIG. 4, the frequency divider 20 includes two input terminals, respectively configured to input 2LO_P and 2LO_N. The 2LO_P and the 2LO_N are a group of differential signals, the 2LO_P is a positive signal, and the 2LO_N is a negative signal. After the divide-by-two frequency divider performs frequency division on the 2LO_P, a group of IQ signals may be obtained, namely, LO_IP and LO_QP. The LO_IP is a frequency-divided in-phase signal, and the LO_QP is a frequency-divided quadrature-phase signal. After the divide-by-two frequency divider performs frequency division on the 2LO_N, a group of IQ signals may be obtained, namely, LO_IN and LO_QN.

The LO_IN is a frequency-divided in-phase signal, and the LO_QN is a frequency-divided quadrature-phase signal.

The frequency divider 20 has four output terminals, respectively configured to output the LO_IP, the LO_QP, the LO_IN, and the LO_QN. Each of the four output terminals is connected to one buffer circuit 10. In the four buffer circuits 10, a first buffer circuit may include I1 and I2, a second buffer circuit may include I3 and I4, a third buffer circuit may include I5 and I6, and a fourth buffer circuit may include I7 and I8. Each of I2, I4, I6, and I8 may be specifically represented as the phase inverter 500. A circuit structure of the phase inverter is not described herein again.

Because specific implementations of I1, I3, I5, and I7 may be the same, and a difference lies only in that first signals input to I1, I2, I3, and I4 are different, and are respectively the LO_IP, the LO_QP, the LO_IN, and the LO_QN, the signal types of the second signal and the third signal are adaptively adjusted. Therefore, putting I1 in a dashed circle in FIG. 4 means that the specific implementation of I1 is described in detail below with reference to the accompanying drawings, and specific implementations of I3, I5, and I7 are not described again.

FIG. 6 to FIG. 9 respectively provides four schematic structural diagrams of one of the four buffer circuits 10 described in the embodiments of this application. Detailed description is provided by using an example in which the first transistor 101 is a P-type MOS transistor, the second transistor 102 is an N-type MOS transistor, the third transistor 201 is a P-type MOS transistor, and the fourth transistor 301 is an N-type MOS transistor. The first transistor 101, the second transistor 102, the third transistor 201, and the fourth transistor 301 are determined as different types of MOS transistors, to improve feasibility of this solution. Because a MOS transistor has low manufacturing costs and uses a small area, manufacturing costs of the buffer circuit 10 are reduced, and space occupied by the buffer circuit 10 is reduced.

For ease of description of this solution, in FIG. 5, each signal period of the first signal is divided into a first stage and a second stage. The first stage is a low-level phase of the first signal in one signal period, and the second stage is a high-level phase of the first signal in one signal period. Because the implementation of I1 is described in FIG. 6 to FIG. 9, when description is provided with reference to FIG. 6 to FIG. 9, the first signal is the LO_IP in FIG. 5, and a signal type is an in-phase signal; the second signal is the 2LO_N in FIG. 5, and a signal type is a negative signal; and the third signal is the 2LO_P in FIG. 5, and a signal type is a positive signal.

In an implementation, referring to FIG. 6, a gate of the first transistor 101 is configured to input the first signal, a source of the first transistor 101 is connected to the power terminal, a drain of the first transistor 101 is connected to a source of the third transistor 201, a gate of the third transistor 201 is configured to input the second signal, a drain of the third transistor 201 is connected to the output terminal 400, a gate of the second transistor 102 is configured to input the first signal, a source of the second transistor 102 is connected to the grounding terminal, a drain of the second transistor 102 is connected to a source of the fourth transistor 301, a gate of the fourth transistor 301 is configured to input the third signal, and a drain of the fourth transistor 301 is connected to the output terminal 400. Further, although not shown in FIG. 6, the output terminal 400 may be further connected to the phase inverter 500.

In this embodiment of this application, in the first stage of the first signal (namely, the LO_IP), when the first signal transitions from a high level to a low level, a voltage at the gate of the first transistor 101 is lower than a voltage at the source, to trigger the first transistor 101 to be connected and the second transistor 102 to be disconnected. However, because the second signal (namely, the 2LO_N) is still in a high-level state in this case, the second transistor 102 is still in a disconnected state, and when the second signal transitions from a high level to a low level, the third transistor 201 is triggered to be connected. Therefore, each of the first transistor 101 and the third transistor 201 is connected, so that the output terminal 400 is connected to a power supply, to trigger the output terminal 400 to stop outputting a low-level signal and start to output a high-level signal, to form the rising edge of the fourth signal. After inversion by the phase inverter 500, referring to LO_I+ in FIG. 5, the rising edge is inverted into the falling edge.

When the second signal (namely, the 2LO_N) transitions from a low level to a high level again, the third transistor 201 is triggered to be disconnected. However, because the first signal is still in a low-level state in the first stage, the second transistor 102 is still in the disconnected state. After the second signal transitions from a low level to a high level, the output terminal 400 is not connected to the power terminal or the grounding terminal. However, parasitic capacitances exist on the two transistors (namely, the third transistor 201 and the fourth transistor 301 in FIG. 6) directly connected to the output terminal 400, so that the output terminal 400 can still continue to output a high-level signal. A parasitic capacitance also exists on the phase inverter 500, and after the high-level signal output by the output terminal 400 is inverted by the phase inverter 500, referring to LO_I+ in FIG. 5, the phase inverter 500 continues to output a low-level signal until the second stage of the first signal is entered.

In this embodiment of this application, in the second stage of the first signal (namely, the LO_IP), when the first signal transitions from a low level to a high level, a voltage at the gate of the second transistor 102 is higher than a voltage at the source, to trigger the first transistor 101 to be disconnected and the second transistor 102 to be connected. However, because the third signal (namely, the 2LO_P) is still in the low-level state in this case, the fourth transistor 301 is still in the disconnected state, in other words, the output terminal 400 still cannot be grounded, so that the output terminal 400 can still continue to output a high-level signal. When the third signal transitions from a low-level state to a high-level state, the fourth transistor 301 is triggered to be connected, so that each of the second transistor 102 and the fourth transistor 301 is connected. Therefore, the output terminal 400 is grounded, to trigger the output terminal 400 to stop outputting a high-level signal and start to output a low-level signal to form the falling edge of the fourth signal. After inversion by the phase inverter 500, referring to LO_I+ in FIG. 5, the falling edge of the fourth signal is inverted into the rising edge.

When the third signal (namely, the 2LO_P) transitions from a high level to a low level again, the fourth transistor 301 is triggered to be disconnected. However, because the first signal is still in the high-level state in the second stage, the first transistor 101 is still in the disconnected state. After the third signal transitions from a high level to a low level again, the output terminal 400 is not connected to the power terminal or the grounding terminal. However, parasitic capacitances exist on the two transistors (namely, the third transistor 201 and the fourth transistor 301 in FIG. 5) directly connected to the output terminal 400, so that the output terminal 400 can continue to output a low-level signal. A parasitic capacitance also exists on the phase inverter 500, and after the low-level signal output by the output terminal 400 is inverted by the phase inverter 500, referring to LO_I+ in FIG. 5, the phase inverter 500 continues to output a high-level signal until a next signal period of the first signal is entered.

Referring to FIG. 5, when each of the first transistor 101 and the third transistor 201 is in a connected state again in the next signal period of the first signal, the output terminal 400 is triggered again to stop outputting a low-level signal and start to output a high-level signal, in other words, the rising edge of the fourth signal is formed again. After inversion by the phase inverter 500, the falling edge is output. When each of the second transistor 102 and the fourth transistor 301 is in the connected state again, the output terminal 400 is triggered again to stop outputting a high-level signal and start to output a low-level signal, in other words, the falling edge of the fourth signal is formed again. After inversion by the phase inverter 500, the rising edge is output.

In another implementation, referring to FIG. 7, a gate of the third transistor 201 is configured to input the second signal, a source of the third transistor 201 is connected to the power terminal, a drain of the third transistor 201 is connected to a source of the first transistor 101, a gate of the first transistor 101 is configured to input the first signal, a drain of the first transistor 101 is connected to the output terminal 400, a gate of the second transistor 102 is configured to input the first signal, a source of the second transistor 102 is connected to the grounding terminal, a drain of the second transistor 102 is connected to a source of the fourth transistor 301, a gate of the fourth transistor 301 is configured to input the third signal, and a drain of the fourth transistor 301 is connected to the output terminal 400. Further, although not shown in FIG. 7, the output terminal 400 may be further connected to the phase inverter 500.

In still another implementation, referring to FIG. 8, a gate of the first transistor 101 is configured to input the first signal, a source of the first transistor 101 is connected to the power terminal, a drain of the first transistor 101 is connected to a source of the third transistor 201, a gate of the third transistor 201 is configured to input the second signal, a drain of the third transistor 201 is connected to the output terminal 400, a gate of the fourth transistor 301 is configured to input the third signal, a source of the fourth transistor 301 is connected to the grounding terminal, a drain of the fourth transistor 301 is connected to a source of the second transistor 102, a gate of the second transistor 102 is configured to input the first signal, and a drain of the second transistor 102 is connected to the output terminal 400. Further, although not shown in FIG. 8, the output terminal 400 may be further connected to the phase inverter 500.

In yet another implementation, referring to FIG. 9, a gate of the third transistor 201 is configured to input the second signal, a source of the third transistor 201 is connected to the power terminal, a drain of the third transistor 201 is connected to a source of the first transistor 101, a gate of the first transistor 101 is configured to input the first signal, a drain of the first transistor 101 is connected to the output terminal 400, a gate of the fourth transistor 301 is configured to input the third signal, a source of the fourth transistor 301 is connected to the grounding terminal, a drain of the fourth transistor 301 is connected to a source of the second transistor 102, a gate of the second transistor 102 is configured to input the first signal, and a drain of the second transistor 102 is connected to the output terminal 400. Further, although not shown in FIG. 9, the output terminal 400 may be further connected to the phase inverter 500.

In this embodiment of this application, a signal input status and a connection/disconnection status of each of the first transistor 101, the second transistor 102, the third transistor 201, and the fourth transistor 301, a signal output status of the output terminal 400, a signal output status of the phase inverter 500, and specific implementation principles of forming the rising edge and the falling edge in FIG. 7 to FIG. 9 are similar to those described in the embodiment corresponding to FIG. 6, and a same part is not described herein again.

The output terminal 400 is directly connected to the third transistor 201 and the fourth transistor 301 in FIG. 6, the output terminal 400 is directly connected to the first transistor 101 and the fourth transistor 301 in FIG. 7, the output terminal 400 is directly connected to the third transistor 201 and the second transistor 102 in FIG. 8, and the output terminal 400 is directly connected to the first transistor 101 and the second transistor 102 in FIG. 9. Therefore, when the output terminal 400 relies on the parasitic capacitance to continue to output a high-level signal or a low-level signal, implementation principles of the implementations shown in FIG. 7 to FIG. 9 are slightly different from the implementation principle of the implementation shown in FIG. 6.

Specifically, in the first stage of the first signal (namely, the LO_IP), when the second signal (namely, the 2LO_N) transitions from a low level to a high level again, the third transistor 201 is triggered to be disconnected, so that when the output terminal 400 is not connected to the power terminal or is not grounded, in the implementation shown in FIG. 6, the output terminal 400 relies on parasitic capacitances on the third transistor 201 and the fourth transistor 301 that are directly connected to the output terminal 400, to continue to output a high-level signal; in the implementation shown in FIG. 7, the output terminal 400 relies on parasitic capacitances on the first transistor 101 and the fourth transistor 301 that are directly connected to the output terminal 400, to continue to output a high-level signal; in the implementation shown in FIG. 8, the output terminal 400 relies on parasitic capacitances on the third transistor 201 and the second transistor 102 that are directly connected to the output terminal 400, to continue to output a high-level signal; and in the implementation shown in FIG. 9, the output terminal 400 relies on parasitic capacitances on the first transistor 101 and the second transistor 102 that are directly connected to the output terminal 400, to continue to output a high-level signal.

In the second stage of the first signal (namely, the LO_IP), when the third signal (namely, the 2LO_P) transitions from a high level to a low level again, the fourth transistor 301 is triggered to be disconnected, so that when the output terminal 400 is not connected to the power terminal or is not grounded, in the implementation shown in FIG. 6, the output terminal 400 relies on parasitic capacitances on the third transistor 201 and the fourth transistor 301 that are directly connected to the output terminal 400, to continue to output a low-level signal; in the implementation shown in FIG. 7, the output terminal 400 relies on parasitic capacitances on the first transistor 101 and the fourth transistor 301 that are directly connected to the output terminal 400, to continue to output a low-level signal; in the implementation shown in FIG. 8, the output terminal 400 relies on parasitic capacitances on the third transistor 201 and the second transistor 102 that are directly connected to the output terminal 400, to continue to output a low-level signal; and in the implementation shown in FIG. 9, the output terminal 400 relies on parasitic capacitances on the first transistor 101 and the second transistor 102 that are directly connected to the output terminal 400, to continue to output a low-level signal.

The foregoing provides four specific implementations of transistor connection locations, in other words, four specific implementations of the buffer circuit 10 are provided, so that a user may determine locations of the first transistor 101, the second transistor 102, the third transistor 201, and the fourth transistor 301 based on a specific requirement of a product. This not only improves operation flexibility of this solution, but also improves feasibility of this solution.

In this embodiment of this application, specific locations and connection relationships of electronic components of I1, I3, I5, and I7 may be similar, but when the frequency divider 20 is a divide-by-two frequency divider, signal inputs of I3, I5, and I7 are different from that of I1, and signals input by I3, I5, and I7 are further described below.

A difference between I3 and I1 lies in that the first signal in I1 is the LO_IP, namely, the I signal in the group of differential signals obtained after the 2LO_P is processed by the divide-by-two frequency divider, and the first signal in I3 is the LO_QP, namely, the Q signal in the group of differential signals obtained after the 2LO_P is processed by the divide-by-two frequency divider. To ensure that a group of IQ signals is output after processing of the buffer circuit 10, in other words, I2 and I4 also output a group of IQ signals, a signal type of a second signal in I3 is opposite to a signal type of a second signal in I1, and a signal type of a third signal in I3 is also opposite to a signal type of a third signal in I1. Specifically, in an example, the second signal in I1 is the 2LO_N, and a signal type is a negative signal; the second signal in I3 is the 2LO_P, and a signal type is a positive signal; the third signal in I1 is the 2LO_P, and a signal type is a positive signal; and the third signal in I3 is the 2LO_N, and a signal type is a negative signal.

The first signal in I5 is the LO_IN, namely, the I signal in the group of differential signals obtained after the 2LO_N is processed by the divide-by-two frequency divider. A second signal in I5 is the 2LO_P, and a signal type is a positive signal; and a third signal is the 2LO_N, and a signal type is a negative signal.

A difference between I7 and I5 lies in that the first signal in I5 is the LO_IN, namely, the I signal in the group of differential signals obtained after the 2LO_N is processed by the divide-by-two frequency divider, and the first signal in I7 is the LO_QN, namely, the Q signal in the group of differential signals obtained after the 2LO_N is processed by the divide-by-two frequency divider. To ensure that a group of IQ signals is output after processing of the buffer circuit 10, in other words, I6 and I8 also output a group of IQ signals, a signal type of a second signal in I7 is opposite to a signal type of a second signal in I5, and a signal type of a third signal in I7 is also opposite to a signal type of a third signal in I5. Specifically, the second signal in I5 is the 2LO_P, and a signal type is a positive signal; the second signal in I7 is the 2LO_N, and a signal type is a negative signal; the third signal in I5 is the 2LO_N, and a signal type is a negative signal; and the third signal in I7 is the 2LO_P, and a signal type is a positive signal.

It can be learned from the foregoing description that when the frequency divider 20 is the divide-by-two frequency divider, in the case in which the first signal is an in-phase signal I and the case in which the first signal is a quadrature-phase signal Q, the signal types of the second signal are opposite, and the signal types of the third signal are opposite. However, it should be understood that specifically, the signal types of the second signal and the third signal should be determined with reference to a signal shape of the first signal provided that it can be ensured that the two buffer circuits 10 each can further output a group of IQ signals after receiving a group of IQ signals.

Figure 10:
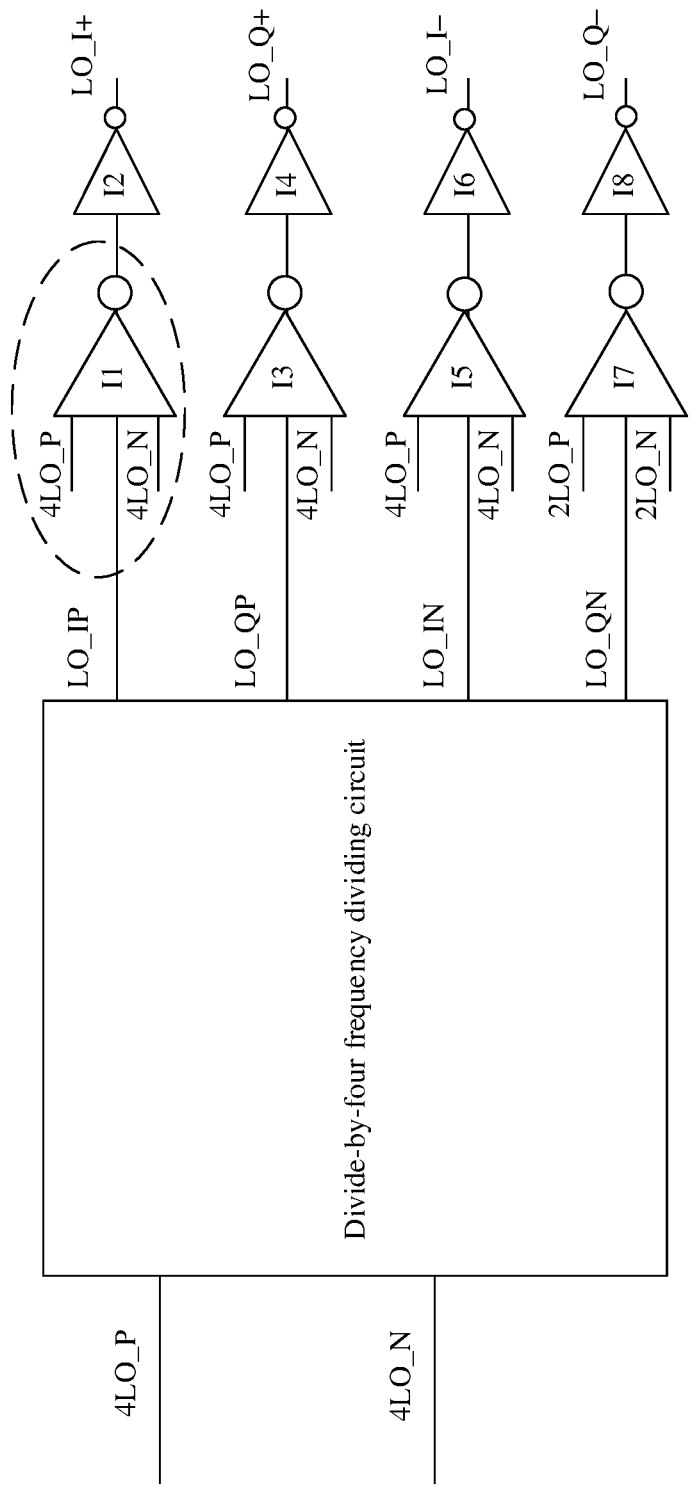
FIG. 10 is still another schematic structural diagram of a frequency dividing circuit according to an embodiment of this application.
Figure 12:
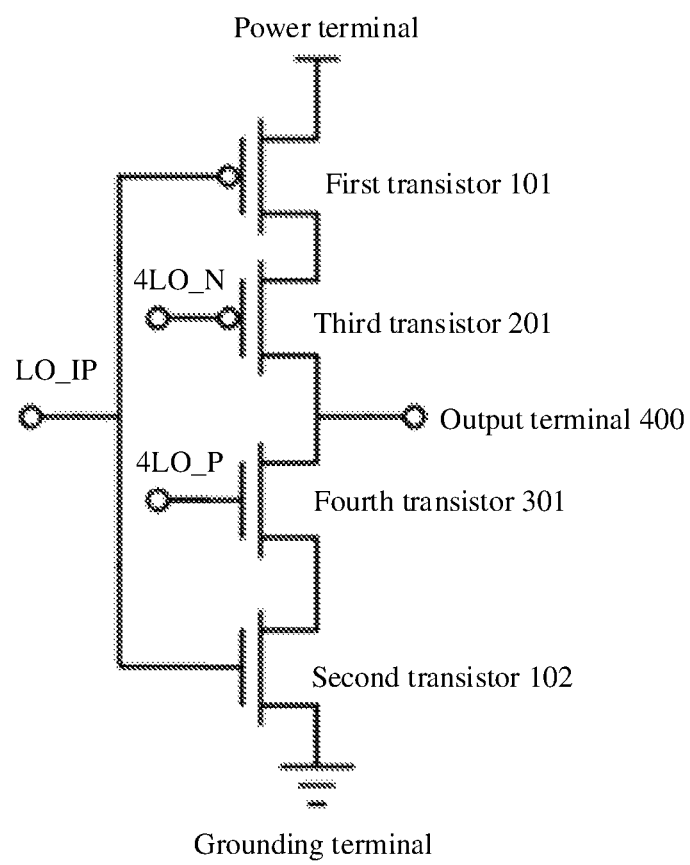
FIG. 12 is a still further schematic structural diagram of a buffer circuit according to an embodiment of this application.

Next, referring to FIG. 10 to FIG. 12, a case in which the frequency divider 20 is a divide-by-four frequency divider is described. FIG. 10 is a schematic structural diagram of the frequency dividing circuit 1 when the frequency divider 20 is the divide-by-four frequency divider. FIG. 11 is a schematic waveform diagram of the first signal, the second signal, the third signal, and a signal that is output by the phase inverter, when the frequency divider 20 is the divide-by-four frequency divider. FIG. 12 is a schematic structural diagram of the buffer circuit 10 when the frequency divider 20 is the divide-by-four frequency divider. Referring to FIG. 10, the frequency divider 20 includes two input terminals, respectively configured to input 4LO_P and 4LO_N. The 4LO_P and the 4LO_N are a group of differential signals, the 4LO_P is a positive signal, and the 4LO_N is a negative signal. After the divide-by-four frequency divider performs frequency division on the 4LO_P, a group of IQ signals may be obtained, namely, LO_IP and LO_QP. The LO_IP is a frequency-divided in-phase signal, and the LO_QP is a frequency-divided quadrature-phase signal. After the divide-by-four frequency divider performs frequency division on the 4LO_N, a group of IQ signals may be obtained, namely, the LO_IN and LO_QN. The LO_IN is a frequency-divided in-phase signal, and the LO_QN is a frequency-divided quadrature-phase signal.

Similar to the divide-by-two frequency divider shown in FIG. 4, referring to FIG. 10, the divide-by-four frequency divider also has four output terminals, respectively configured to output the LO_IP, the LO_QP, the LO_IN, and the LO_QN. Each of the four output terminals is connected to one buffer circuit 10. In the four buffer circuits 10, a first buffer circuit may include I1 and I2, a second buffer circuit may include I3 and I4, a third buffer circuit may include I5 and I6, and a fourth buffer circuit may include I7 and I8. Each of I2, I4, I6, and I8 may be specifically represented as the phase inverter 500. A circuit structure of the phase inverter is not described herein again. When the frequency divider 20 is the divide-by-four frequency divider, specific locations and connection relationships of electronic components of I1, I3, I5, and I7 may be similar. The following describes only a specific implementation structure of I1 when the frequency divider 20 is the divide-by-four frequency divider.

For ease of description of this solution, in FIG. 11, each signal period of the first signal is divided into a first stage and a second stage. The first stage is a low-level phase of the first signal in one signal period, and the second stage is a high-level phase of the first signal in one signal period. The first signal is the LO_IP in FIG. 11, and a signal type is an in-phase signal. The second signal is the 4LO_N in FIG. 11, and a signal type is a negative signal. The third signal is the 4LO_P in FIG. 11, and a signal type is a positive signal.

In an implementation, referring to FIG. 12, a gate of the first transistor 101 is configured to input the first signal, a source of the first transistor 101 is connected to the power terminal, a drain of the first transistor 101 is connected to a source of the third transistor 201, a gate of the third transistor 201 is configured to input the second signal, a drain of the third transistor 201 is connected to the output terminal 400, a gate of the second transistor 102 is configured to input the first signal, a source of the second transistor 102 is connected to the grounding terminal, a drain of the second transistor 102 is connected to a source of the fourth transistor

301, a gate of the fourth transistor 301 is configured to input the third signal, and a drain of the fourth transistor 301 is connected to the output terminal 400. Further, although not shown in FIG. 12, the output terminal 400 may be further connected to the phase inverter 500.

In this embodiment of this application, in the first stage of the first signal (namely, the LO_IP), when the first signal transitions from a high level to a low level, a voltage at the gate of the first transistor 101 is lower than a voltage at the source, to trigger the first transistor 101 to be connected and the second transistor 102 to be disconnected. However, because the second signal (namely, the 4LO_N) is still in a high-level state in this case, the second transistor 102 is still in a disconnected state, and when the second signal transitions from a high level to a low level for the first time, the third transistor 201 is triggered to be connected. Therefore, each of the first transistor 101 and the third transistor 201 is connected, so that the output terminal 400 is connected to a power supply, to trigger the output terminal 400 to stop outputting a low-level signal and start to output a high-level signal, to form the rising edge of the output signal of transitioning from a low level to a high level. After inversion by the phase inverter 500, referring to LO_I+ in FIG. 11, the rising edge is inverted into a transition from a high level to a low level.

When the second signal (namely, the 4LO_N) transitions from a low level to a high level again, the third transistor 201 is triggered to be disconnected. However, because the first signal is still in a low-level state in the first stage, the second transistor 102 is still in the disconnected state. After the second signal transitions from a low level to a high level, the output terminal 400 is not connected to the power terminal or the grounding terminal. However, parasitic capacitances exist on the two transistors (namely, the third transistor 201 and the fourth transistor 301 in FIG. 12) directly connected to the output terminal 400, so that the output terminal 400 can still continue to output a high-level signal. A parasitic capacitance also exists on the phase inverter 500, and after the high-level signal output by the output terminal 400 is inverted by the phase inverter 500, referring to LO_I+ in FIG. 11, the phase inverter 500 continues to output a low-level signal.

When the second signal (namely, the 4LO_N) transitions from a high level to a low level again, in other words, when the second signal transitions from a high level to a low level not for the first time, the third transistor 201 is triggered again to be connected. Therefore, each of the first transistor 101 and the third transistor 201 is connected, so that the output terminal 400 is connected to the power supply. However, because the output terminal 400 outputs a high-level signal in this case, the output terminal 400 continues to output a high-level signal. After inversion by the phase inverter 500, referring to LO_I+ in FIG. 11, the phase inverter 500 continues to output a low-level signal, and the rising edge of the fourth signal is no longer formed.

When the second signal (namely, the 4LO_N) transitions from a low level to a high level again, the third transistor 201 is triggered to be disconnected. However, because the first signal is still in the low-level state in the first stage, the second transistor 102 is still in the disconnected state. After the second signal transitions from a low level to a high level again, the output terminal 400 is not connected to the power terminal or the grounding terminal. However, parasitic capacitances exist on the two transistors (namely, the third transistor 201 and the fourth transistor 301 in FIG. 12) directly connected to the output terminal 400, so that the output terminal 400 continues to output a high-level signal. A parasitic capacitance also exists on the phase inverter 500, and after inversion by the phase inverter 500, referring to LO_I+ in FIG. 11, the phase inverter 500 continues to output a low-level signal until the second stage of the first signal is entered.

In this embodiment of this application, in the second stage of the first signal (namely, the LO_IP), when the first signal transitions from a low level to a high level, a voltage at the gate of the second transistor 102 is higher than a voltage at the source, to trigger the first transistor 101 to be disconnected and the second transistor 102 to be connected. However, because the third signal (namely, the 4LO_P) is still in the low-level state in this case, the fourth transistor 301 is still in the disconnected state, in other words, the output terminal 400 still cannot be grounded, so that the output terminal 400 can still continue to output a high-level signal. When the third signal transitions from the low-level state to the high-level state, the fourth transistor 301 is triggered to be connected, so that each of the second transistor 102 and the fourth transistor 301 is connected. Therefore, the output terminal 400 is grounded, to trigger the output terminal 400 to stop outputting a high-level signal and start to output a low-level signal to form the falling edge of the fourth signal. After inversion by the phase inverter 500, referring to LO_I+ in FIG. 11, the falling edge of the fourth signal is inverted into the rising edge.

When the third signal (namely, the 4LO_P) transitions from a high level to a low level again, the fourth transistor 301 is triggered to be disconnected. However, because the first signal is still in the high-level state in the second stage, the first transistor 101 is still in the disconnected state. After the third signal transitions from a high level to a low level again, the output terminal 400 is not connected to the power terminal or the grounding terminal. However, parasitic capacitances exist on the two transistors (namely, the third transistor 201 and the fourth transistor 301 in FIG. 12) directly connected to the output terminal 400, so that the output terminal 400 can still continue to output a low-level signal. A parasitic capacitance also exists on the phase inverter 500, and after the low-level signal output by the output terminal 400 is inverted by the phase inverter 500, referring to LO_I+ in FIG. 11, the phase inverter 500 continues to output a high-level signal.

When the third signal (namely, the 4LO_P) transitions from a low level to a high level again, in other words, when the third signal transitions from a low level to a high level not for the first time, the fourth transistor 301 is triggered again to be connected. Therefore, each of the second transistor 102 and the fourth transistor 301 is connected, so that the output terminal 400 is grounded. However, because the output terminal 400 outputs a low-level signal in this case, the output terminal 400 continues to output a low-level signal. After inversion by the phase inverter 500, referring to LO_I+ in FIG. 11, the phase inverter 500 continues to output a high-level signal, and the falling edge of the fourth signal is no longer formed.

When the third signal (namely, the 4LO_P) transitions from a high level to a low level again, the fourth transistor 301 is triggered to be disconnected. However, because the first signal is still in the high-level state in the second stage, the first transistor 101 is still in the disconnected state. After the third signal transitions from a high level to a low level again, the output terminal 400 is not connected to the power terminal or the grounding terminal. However, parasitic capacitances exist on the two transistors (namely, the third transistor 201 and the fourth transistor 301 in FIG. 12) directly connected to the output terminal 400, so that the output terminal 400 can continue to output a low-level signal. A parasitic capacitance also exists on the phase inverter 500, and after inversion by the phase inverter 500, referring to LO_I+ in FIG. 11, the phase inverter 500 continues to output a high-level signal until a next signal period of the first signal is entered.

Referring to FIG. 11, when each of the first transistor 101 and the third transistor 201 is in a connected state again in the next signal period of the first signal, the output terminal 400 is triggered again to stop outputting a low-level signal and start to output a high-level signal. After inversion by the phase inverter 500, the falling edge is output. When each of the second transistor 102 and the fourth transistor 301 is in the connected state again, the output terminal 400 is triggered again to stop outputting a high-level signal and start to output a low-level signal. After inversion by the phase inverter 500, the rising edge is output.

In this embodiment of this application, when a value of N in the divide-by-N frequency divider 20 is greater than 2, in the low-level signal period of the first signal, the second signal transitions from a low level to a high level at least twice, and when the second signal transitions from a low level to a high level not for the first time, the output terminal 400 no longer forms the rising edge of the fourth signal. In the high-level signal period of the first signal, the third signal transitions from a high level to a low level at least twice, and when the third signal transitions from a high level to a low level not for the first time, the output terminal 400 no longer forms the falling edge of the fourth signal. A signal output status when the value of N in the divide-by-N frequency divider 20 is greater than 2 is further improved, feasibility of this solution is improved, and it is proved that this solution can be applied to various frequency dividers 20, to improve comprehensiveness of this solution.

In this embodiment of this application, when the frequency divider 20 is a divide-by-four frequency divider, locations and connection relationships of electronic components in I1 are similar to the implementation of I1 when the frequency divider 20 is the divide-by-two frequency divider. It can be learned from comparison between FIG. 6 and FIG. 12 that in the case in which the frequency divider 20 is the divide-by-two frequency divider and the case in which the frequency divider 20 is the divide-by-four frequency divider, locations and connection relationships of the electronic components in the buffer circuit 10 are similar, and a difference lies only in that the input first signals, second signals, and third signals are different. In other words, the four structures described in FIG. 7 to FIG. 9 may also be used when the frequency divider 20 is the divide-by-four frequency divider, and in the three structures described in FIG. 7 to FIG. 9, only the first signal needs to be replaced with the LO_IP in FIG. 11, the second signal needs to be replaced with the 4LO_N in FIG. 11, and the third signal needs to be replaced with the 4LO_P in FIG. 11. Specific locations and connection relationships of the electronic components are consistent with those described in FIG. 7 to FIG. 9. Therefore, other three implementations of I1 when the frequency divider 20 is the divide-by-four frequency divider are not described herein again.

Next, a signal input status of each of I3, I5, and I7 when the frequency divider 20 is the divide-by-four frequency divider is further explained and described.

A difference between I3 and I1 lies in that referring to FIG. 10 and FIG. 11, the first signal in I1 is the LO_IP, namely, the I signal in the group of differential signals obtained after the 4LO_P is processed by the divide-by-four frequency divider, and the first signal in I3 is the LO_QP, namely, the Q signal in the group of differential signals obtained after the 4LO_P is processed by the divide-by-four frequency divider. To ensure that a group of IQ signals is also output after processing of the buffer circuit 10, in other words, I2 and I4 in FIG. 10 also output a group of IQ signals, a signal type of a second signal in I3 is the same as a signal type of a second signal in I1, a signal type of a third signal in I3 is also the same as a signal type of a third signal in I1. Specifically, in an example, the second signal in I1 is the 4LO_N, and a signal type is a negative signal; the second signal in I3 is the 4LO_N, and a signal type is a negative signal; the third signal in I1 is the 4LO_P, and a signal type is a positive signal; and the third signal in I3 is the 4LO_P, and a signal type is a positive signal.

The first signal in I5 is the LO_IN, namely, the I signal in the group of differential signals obtained after the 4LO_N is processed by the divide-by-four frequency divider. A second signal in I5 is the 4LO_N, and a signal type is a negative signal; and a third signal is the 4LO_P, and a signal type is a positive signal.

A difference between I7 and I5 lies in that the first signal in I5 is the LO_IN, namely, the I signal in the group of differential signals obtained after the 4LO_N is processed by the divide-by-four frequency divider, and the first signal in I7 is the LO_QN, namely, the Q signal in the group of differential signals obtained after the 4LO_N is processed by the divide-by-four frequency divider. To ensure that a group of IQ signals are also output after processing of the buffer circuit 10, in other words, I6 and I8 also output a group of IQ signals, a signal type of a second signal in I7 is the same as the signal type of the second signal in I5, a signal type of a third signal in I7 is also the same as the signal type of the third signal in I5. Specifically, the second signal in I5 is the 4LO_N, and the signal type is a negative signal; the second signal in I7 is the 4LO_N, and the signal type is a negative signal; the third signal in I5 is the 4LO_P, and the signal type is a positive signal; and the third signal in I7 is the 4LO_P, and the signal type is a positive signal.

It can be learned from the foregoing description that different from the case in which the frequency divider 20 is the divide-by-two frequency divider, when the frequency divider 20 is the divide-by-four frequency divider, in the case in which the first signal is an in-phase signal I and the case in which the first signal is a quadrature-phase signal Q, the signal types of the second signal are the same, and the signal types of the third signal are the same. However, it should be understood that specifically, the signal types of the second signal and the third signal should be determined with reference to a signal shape of the first signal provided that it can be ensured that the two buffer circuits 10 can further output a group of IQ signals after receiving a group of IQ signals.

Figure 13:
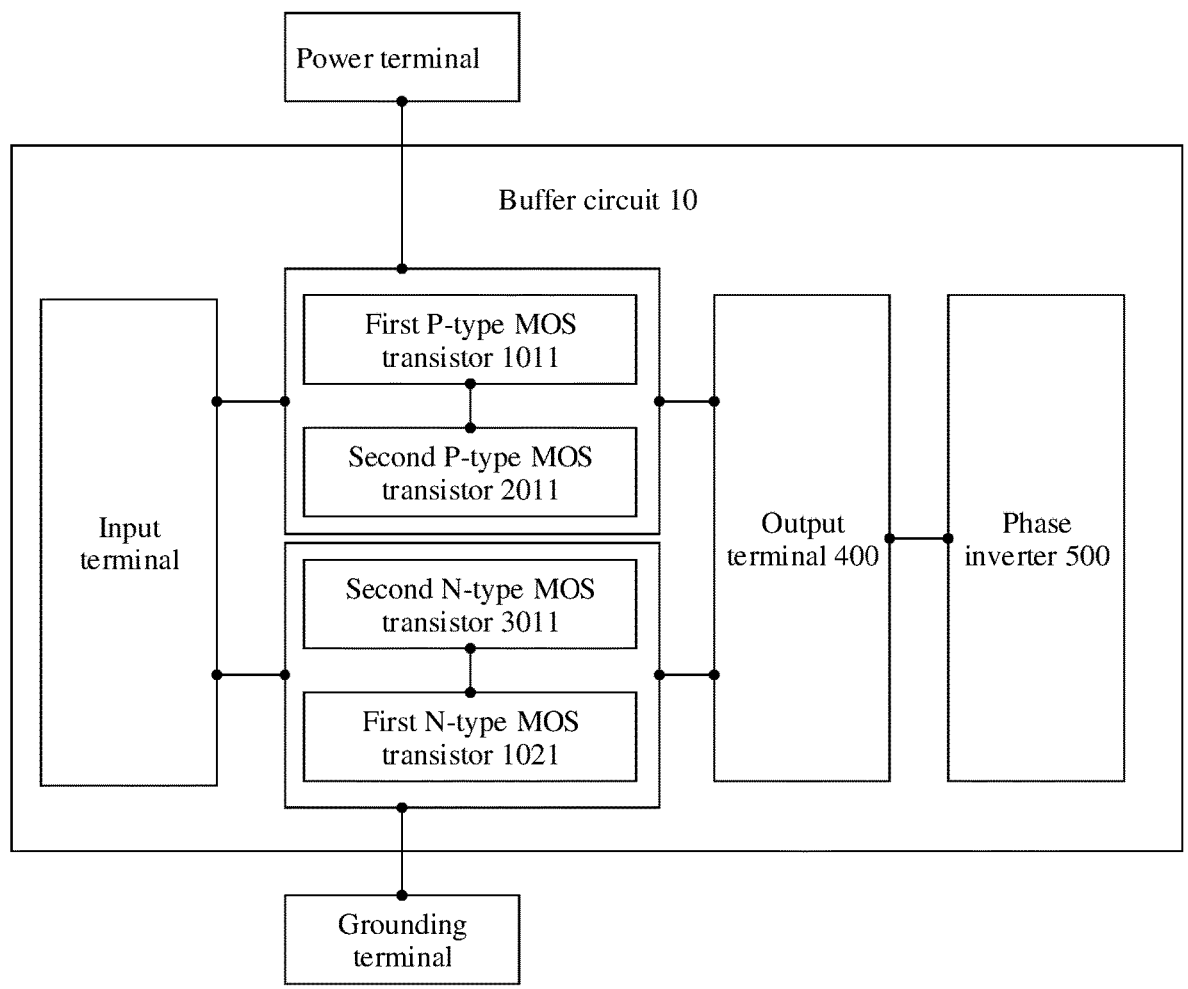
FIG. 13 is a yet further schematic structural diagram of a buffer circuit according to an embodiment of this application.

An embodiment of this application further provides another buffer circuit 10. FIG. 13 is a schematic structural diagram of the buffer circuit 10 provided in this embodiment of this application. The buffer circuit 10 includes a buffer 100, a second P-type MOS transistor 2011, and a second N-type MOS transistor 3011. The buffer 100 includes a first P-type MOS transistor 1011 and a first N-type MOS transistor 1021, and gates of the first P-type MOS transistor 1011 and the first N-type MOS transistor 1021 are separately coupled to an input terminal. A source of the first P-type MOS transistor 1011 is coupled to a power terminal, a drain of the first P-type MOS transistor 1011 is coupled to an output terminal 400, a source of the first N-type MOS transistor 1021 is coupled to a grounding terminal, and a drain of the first N-type MOS transistor 1021 is coupled to the output terminal 400. The second P-type MOS transistor 2011 is configured to control connection or disconnection between the output terminal 400 and the power terminal, and the second N-type MOS transistor 3011 is configured to control connection or disconnection between the output terminal 400 and the grounding terminal.

In this embodiment of this application, the buffer circuit 10 includes the buffer 100, the second P-type MOS transistor 2011, and the second N-type MOS transistor 3011. The buffer includes the first P-type MOS transistor 1011 and the first N-type MOS transistor 1021. Because the first P-type MOS transistor 1011 and the second P-type MOS transistor 2011 are coupled between the output terminal 400 and the power terminal, when low-level signals are input to the first P-type MOS transistor 1011 and the second P-type MOS transistor 2011, the output terminal 400 may output a high-level signal. Because the first N-type MOS transistor 1021 and the second N-type MOS transistor 3011 are coupled between the output terminal 400 and the grounding terminal, when high-level signals are input to the first N-type MOS transistor 1021 and the second N-type MOS transistor 3011, the output terminal 400 may output a low-level signal. When a frequency-divided first signal output by a frequency divider is input to the first P-type MOS transistor 1011 and the first N-type MOS transistor 1021, an input signal of the second P-type MOS transistor 2011 may be adjusted to control connection or disconnection between the output terminal 400 and the power terminal, and an input signal of the second N-type MOS transistor 3011 may be adjusted to control connection or disconnection between the output terminal 400 and the grounding terminal, to further perform delay control on level transition edges of a fourth signal output by the output terminal 400. When a group of differential signals on which no frequency division is performed are input to the second P-type MOS transistor 2011 and the third N-type MOS transistor 3011, the fourth signal output by the output terminal 400 is controlled by the group of differential signals on which no frequency division is performed, to cancel frequency divider noise introduced into the first signal.

In a possible design, the buffer is coupled to the frequency divider, the gates of the first P-type MOS transistor 1011 and the first N-type MOS transistor 1021 are configured to input the first signal, a gate of the second P-type MOS transistor 2011 is configured to input a second signal, a source of the second P-type MOS transistor 2011 is coupled to the power terminal, a drain of the second P-type MOS transistor 2011 is coupled to the output terminal 400, a gate of the second N-type MOS transistor 3011 is configured to input a third signal, a source of the second N-type MOS transistor 3011 is coupled to the grounding terminal, and a drain of the second N-type MOS transistor 3011 is coupled to the output terminal 400. The first signal is obtained by the frequency divider by performing frequency division on the group of differential signals, and the differential signals include the second signal and the third signal.

In a possible design, a source of the first P-type MOS transistor 1011 is connected to the power terminal, a drain of the first P-type MOS transistor 1011 is connected to the source of the second P-type MOS transistor 2011, and the drain of the second P-type MOS transistor 2011 is connected to the output terminal 400. A source of the first N-type MOS transistor 1021 is connected to the grounding terminal, a drain of the first N-type MOS transistor 1021 is connected to the source of the second N-type MOS transistor 3011, and the drain of the second N-type MOS transistor 3011 is connected to the output terminal 400.

In a possible design, a source of the second P-type MOS transistor 2011 is connected to the power terminal, a drain of the second P-type MOS transistor 2011 is connected to the source of the first P-type MOS transistor 1011, and the drain of the first P-type MOS transistor 1011 is connected to the output terminal 400. A source of the first N-type MOS transistor 1021 is connected to the grounding terminal, a drain of the first N-type MOS transistor 1021 is connected to the source of the second N-type MOS transistor 3011, and the drain of the second N-type MOS transistor 3011 is connected to the output terminal 400.

In a possible design, a source of the first P-type MOS transistor 1011 is connected to the power terminal, a drain of the first P-type MOS transistor 1011 is connected to the source of the second P-type MOS transistor 2011, and the drain of the second P-type MOS transistor 2011 is connected to the output terminal 400. A source of the second N-type MOS transistor 3011 is connected to the grounding terminal, a drain of the second N-type MOS transistor 3011 is connected to the source of the first N-type MOS transistor 1021, and the drain of the first N-type MOS transistor 1021 is connected to the output terminal 400.

In a possible design, a source of the second P-type MOS transistor 2011 is connected to the power terminal, a drain of the second P-type MOS transistor 2011 is connected to the source of the first P-type MOS transistor 1011, and the drain of the first P-type MOS transistor 1011 is connected to the output terminal 400. A source of the second N-type MOS transistor 3011 is connected to the grounding terminal, a drain of the second N-type MOS transistor 3011 is connected to the source of the first N-type MOS transistor 1021, and the drain of the first N-type MOS transistor 1021 is connected to the output terminal 400.

In a possible design, the buffer circuit 10 further includes a phase inverter, and the phase inverter 500 is coupled to the output terminal 400.

It should be understood that this embodiment of this application may be considered as an embodiment in which each of the first transistor 101, the second transistor 102, the third transistor 201, and the fourth transistor 301 in the embodiments shown in FIG. 1 to FIG. 12 implements a corresponding function by using a MOS transistor. Therefore, for connection manners of the components and specific implementations of signal input and output in the buffer circuit 10 provided in this embodiment of this application, refer to the descriptions in the embodiments shown in FIG. 1 to FIG. 12. Details are not described herein again.

Figure 14:
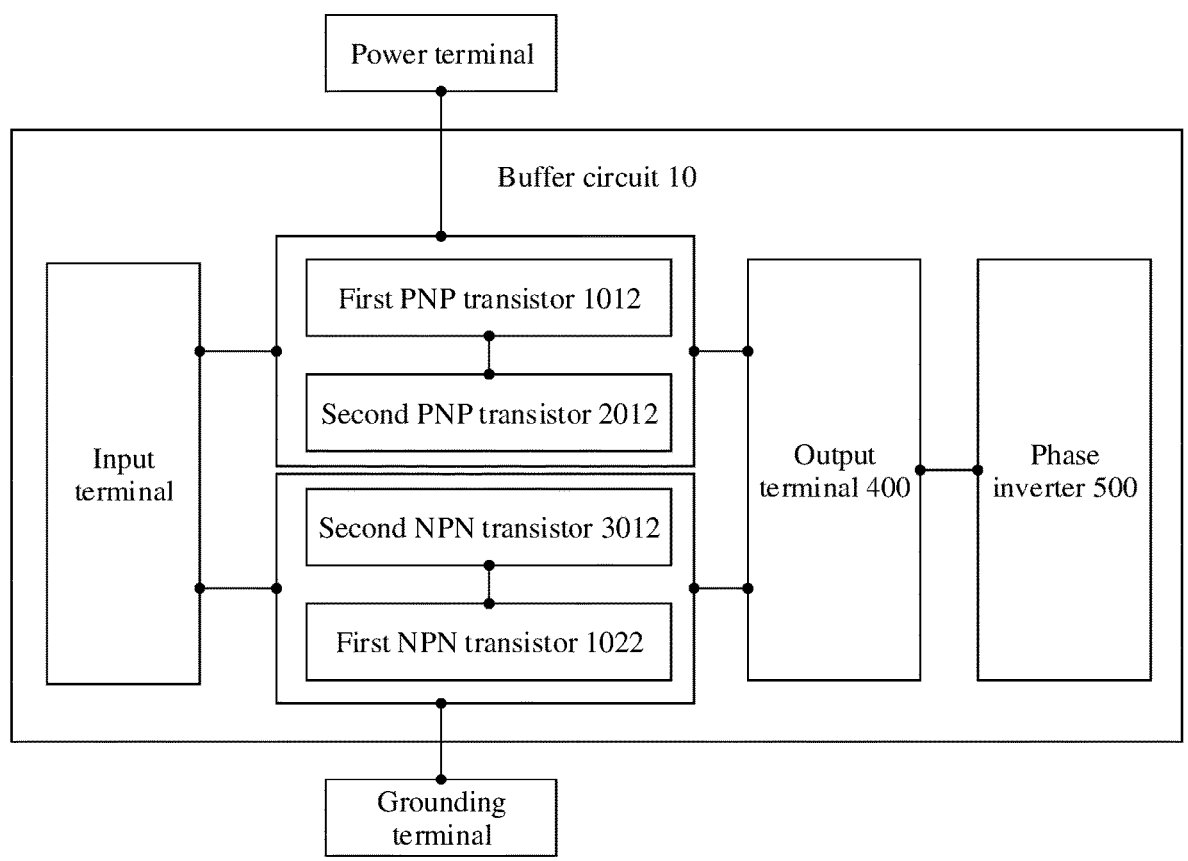
FIG. 14 is a still yet further schematic structural diagram of a buffer circuit according to an embodiment of this application.

An embodiment of this application further provides another buffer circuit 10. FIG. 14 is a schematic structural diagram of the buffer circuit 10 provided in this embodiment of this application. The buffer circuit 10 includes a buffer 100, a second PNP transistor 2012, and a second NPN transistor 3012. The buffer 100 includes a first PNP transistor 1012 and a first NPN transistor 1022, and bases of the first PNP transistor 1012 and the first NPN transistor 1022 are separately coupled to an input terminal. An emitter of the first PNP transistor 1012 is coupled to a power terminal, a collector of the first PNP transistor 1012 is coupled to an output terminal 400, an emitter of the first NPN transistor 1022 is coupled to a grounding terminal, and a collector of the first NPN transistor 1022 is coupled to the output terminal 400. The second PNP transistor 2012 is configured to control connection or disconnection between the output terminal 400 and the power terminal, and the second NPN transistor 3012 is configured to control connection or disconnection between the output terminal 400 and the grounding terminal.

In this embodiment of this application, the buffer circuit 10 includes the buffer 100, the second PNP transistor 2012, and the second NPN transistor 3012. The buffer includes the first PNP transistor 1012 and the first NPN transistor 1022. Because the first PNP transistor 1012 and the first NPN transistor 1022 are coupled between the output terminal 400 and the power terminal, when a low-level signal is input to the first PNP transistor 1012 and the first NPN transistor 1022, the output terminal 400 may output a high-level signal. Because the second PNP transistor 2012 and the second NPN transistor 3012 are coupled between the output terminal 400 and the grounding terminal, when high-level signals are input to the second PNP transistor 2012 and the second NPN transistor 3012, the output terminal 400 may output a low-level signal. When a frequency-divided first signal output by the frequency divider is input to the first PNP transistor 1012 and the first NPN transistor 1022, an input signal of the second PNP transistor 2012 may be adjusted to control connection or disconnection between the output terminal 400 and the power terminal, and an input signal of the second NPN transistor 3012 may be adjusted to control connection or disconnection between the output terminal 400 and the grounding terminal, to further perform delay control on level transition edges of a fourth signal output by the output terminal 400. When a group of differential signals on which no frequency division is performed are input to the second PNP transistor 2012 and the second NPN transistor 3012, the fourth signal output by the output terminal 400 is controlled by the group of differential signals on which no frequency division is performed, to cancel frequency divider noise introduced into the first signal.

In a possible design, the buffer is coupled to a frequency divider, the bases of the first PNP transistor 1012 and the first NPN transistor 1022 are configured to input the first signal, a base of the second PNP transistor 2012 is configured to input a second signal, an emitter of the second PNP transistor 2012 is coupled to the power terminal, a collector of the second PNP transistor 2012 is coupled to the output terminal 400, a base of the second NPN transistor 3012 is configured to input a third signal, an emitter of the second NPN transistor 3012 is coupled to the grounding terminal, and a collector of the second NPN transistor 3012 is coupled to the output terminal 400. The first signal is obtained by the frequency divider by performing frequency division on the group of differential signals, and the differential signals include the second signal and the third signal.

In a possible design, the emitter of the first PNP transistor 1012 is connected to the power terminal, the collector of the first PNP transistor 1012 is connected to an emitter of the second PNP transistor 2012, and a collector of the second PNP transistor 2012 is connected to the output terminal 400. The emitter of the first NPN transistor 1022 is connected to the grounding terminal, the collector of the first NPN transistor 1022 is connected to an emitter of the second NPN transistor 3012, and a collector of the second NPN transistor 3012 is connected to the output terminal 400.

In a possible design, an emitter of the second PNP transistor 2012 is connected to the power terminal, a collector of the second PNP transistor 2012 is connected to the emitter of the first PNP transistor 1012, and the collector of the first PNP transistor 1012 is connected to the output terminal 400. The emitter of the first NPN transistor 1022 is connected to the grounding terminal, the collector of the first NPN transistor 1022 is connected to an emitter of the second NPN transistor 3012, and a collector of the second NPN transistor 3012 is connected to the output terminal 400.

In a possible design, the emitter of the first PNP transistor 1012 is connected to the power terminal, the collector of the first PNP transistor 1012 is connected to an emitter of the second PNP transistor 2012, and a collector of the second PNP transistor 2012 is connected to the output terminal 400. An emitter of the second NPN transistor 3012 is connected to the grounding terminal, a collector of the second NPN transistor 3012 is connected to the emitter of the first NPN transistor 1022, and the collector of the first NPN transistor 1022 is connected to the output terminal 400.

In a possible design, an emitter of the second PNP transistor 2012 is connected to the power terminal, a collector of the second PNP transistor 2012 is connected to the emitter of the first PNP transistor 1012, and the collector of the first PNP transistor 1012 is connected to the output terminal 400. An emitter of the second NPN transistor 3012 is connected to the grounding terminal, a collector of the second NPN transistor 3012 is connected to the emitter of the first NPN transistor 1022, and the collector of the first NPN transistor 1022 is connected to the output terminal 400.

In a possible design, the buffer circuit 10 further includes a phase inverter, and the phase inverter 500 is coupled to the output terminal 400.

It should be understood that this embodiment of this application may be considered as an embodiment in which each of the first transistor 101, the second transistor 102, the third transistor 201, and the fourth transistor 301 in the embodiments shown in FIG. 1 to FIG. 12 implements a corresponding function by using a triode. The difference lies only in that the first transistor 101 is replaced with the first PNP transistor 1012, the second transistor 102 is replaced with the first NPN transistor 1022, the third transistor 201 is replaced with the second PNP transistor 2012, and the fourth transistor 301 is replaced with the second NPN transistor 3012. A gate of a transistor (a MOS transistor) is equivalent to a base of a triode, a source of the transistor (the MOS transistor) is equivalent to an emitter of the triode, and a drain of the transistor (the MOS transistor) is equivalent to a collector of the triode. Therefore, for connection manners of the components and specific implementations of signal input and output in the buffer circuit 10 provided in this embodiment of this application, refer to the descriptions in the embodiments shown in FIG. 1 to FIG. 12. Details are not described herein again.

An embodiment of this application further provides a frequency dividing circuit 1. The frequency dividing circuit 1 includes the frequency divider 20 and at least two buffer circuits 10.

In this embodiment of this application, the frequency divider 20 is configured to perform frequency division on a group of differential signals, to obtain at least two frequency-divided first signals. The group of differential signals includes a second signal and a third signal. The frequency divider 20 includes at least two output terminals, and each of the at least two output terminals is configured to output one first signal.

Each of the at least two buffer circuits 10 may be the buffer circuit 10 in the embodiments shown in FIG. 1 to FIG. 12, or may be the buffer circuit 10 in the embodiment shown in FIG. 13, or may be the buffer circuit 10 in the embodiment shown in FIG. 14, and is configured to be coupled to one of the at least two output terminals.

In this embodiment of this application, the frequency divider 20 includes at least two output terminals. Specifically, the frequency divider 20 may include two output terminals, and correspondingly, there are also two buffer circuits 10. Alternatively, the frequency divider 20 may include four output terminals, and correspondingly, there are also four buffer circuits 10. There may be another quantity of output terminals and another quantity of buffer circuits 10. This is not specifically limited herein.

In this embodiment of this application, the frequency dividing circuit 1 includes the buffer circuits 10 and the frequency divider 20. The buffer circuit 10 performs reverse gain amplification on the first signal output by the frequency divider 20, and outputs a fourth signal, to perform delay control on a rising edge and a falling edge of the frequency-divided signal respectively by using the second signal and the third signal on which no frequency division is performed, to cancel noise generated by the frequency divider. When the second signal and the third signal are square wave signals with a duty ratio of 50%, the first signal and the fourth signal are also square wave signals with a duty ratio of 50%. When the foregoing solution is applied to a Wi-Fi transmitter, a frequency mixer can use the fourth signal with a duty ratio of 50%, to obtain a higher gain and higher linearity.

For connection manners of the components in the buffer circuit 10 provided in this embodiment of this application, refer to the connection manners of the components in the buffer circuit 10 in the embodiments shown in FIG. 1 to FIG. 14. Details are not described herein again.

Figure 15:
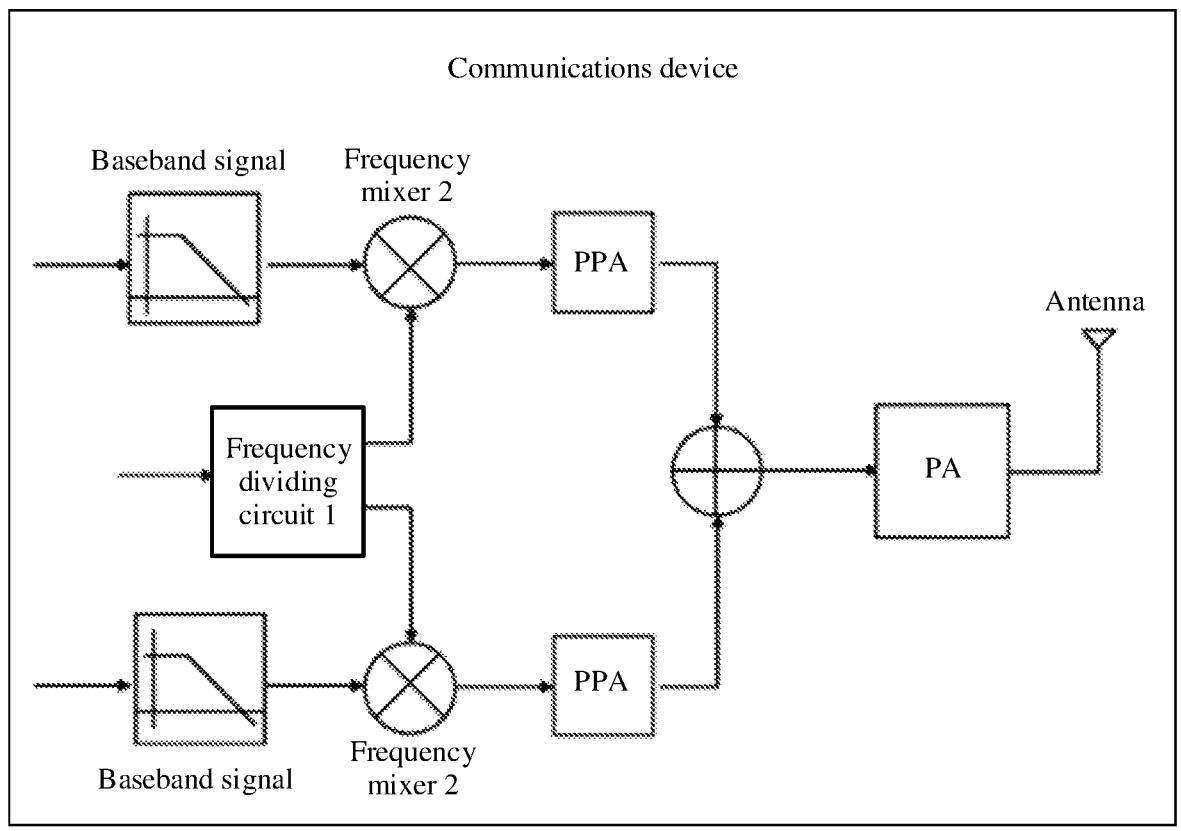
FIG. 15 is a schematic structural diagram of a communications device according to an embodiment of this application.

An embodiment of this application further provides a communications device. FIG. 15 is a schematic structural diagram of the communications device provided in this embodiment of this application. The communications device includes a frequency divider 20, buffer circuits 10, and frequency mixers 2.

In this embodiment of this application, the buffer circuit 10 may be the buffer circuit 10 in the embodiments shown in FIG. 1 to FIG. 12, or may be the buffer circuit 10 in the embodiment shown in FIG. 13, or may be the buffer circuit 10 in the embodiment shown in FIG. 14, and is configured to input a frequency-divided first signal output by the frequency divider 20, and output an adjusted local-frequency signal. The frequency mixer 2 is configured to perform down-conversion on an input radio frequency signal by using the local-frequency signal, or the frequency mixer 2 is configured to perform up-conversion on an input radio frequency signal by using the local-frequency signal.

The local-frequency signal is the fourth signal output by the frequency dividing circuit 1 in the embodiments described in FIG. 1 to FIG. 12, and may be specifically a clock signal with a duty ratio of 50%.

Specifically, when the communications device is a communications device having a sending function, the communications device includes but is not limited to various types of transmitters, a terminal device having a sending function, a network device having a sending function, or the like. The network device is a network side device, and may be specifically represented as a base station or the like. FIG. 15 is a schematic structural diagram of the communications device provided in this embodiment of this application. The communications device includes at least two frequency mixers 2. After a group of differential signals passes through the frequency dividing circuit 1, at least two groups of local-frequency signals are output. Each group of local-frequency signals is input to one frequency mixer 2. Each of the two frequency mixers 2 performs up-conversion on the input radio frequency signal by using the local-frequency signals, then, a pre-power amplifier (PPA) performs amplification, then, two amplified signals are added, and after being amplified by a power amplifier (PA), an added signal may be transmitted by using an antenna.

When the communications device is a communications device having a receiving function, the communications device includes but is not limited to various types of transmitters, a terminal device having a receiving function, a network device having a receiving function, or the like. The network device is a network side device, and may be specifically represented as a base station or the like. The communications device also includes at least two frequency mixers 2. After a group of differential signals passes through the frequency dividing circuit 1, at least two groups of local-frequency signals are output, and each group of local-frequency signals is input to one frequency mixer 2. After the communications device receives a radio frequency signal by using an antenna, the radio frequency signal may be amplified by using a low noise amplifier (LNA), and then, each of the two frequency mixers 2 performs down-conversion on the amplified radio frequency signal by using the local-frequency signals, to obtain baseband signals.

In this embodiment of this application, the frequency dividing circuit 1 and the frequency mixers 2 may be coupled to a same chip system, or may be represented as two independent electronic components. Specific implementations of the frequency dividing circuit 1 and the frequency mixers 2 may be flexibly determined with reference to an actual status. This is not limited herein.

In this embodiment of this application, the communications device includes the frequency dividing circuit 1 and the frequency mixers 2, and the frequency dividing circuit 1 includes the buffer circuits 10 and the frequency divider 20. The buffer circuit 10 performs delay control on a rising edge and a falling edge of the frequency-divided fourth signal by using the second signal and the third signal on which no frequency division is performed, to cancel noise introduced by the frequency divider 20, and improve noise performance of the frequency-divided signal. When the second signal and the third signal are square wave signals with a duty ratio of 50%, the fourth signal is also a square wave signal with a duty ratio of 50%. Then, the frequency mixer can use the fourth signal with a duty ratio of 50%, to obtain a higher gain and higher linearity.

For connection manners of the components in the buffer circuit 10 in the network device provided in this embodiment of this application, refer to the connection manners of the components in the buffer circuit 10 in the embodiments shown in FIG. 1 to FIG. 14. Details are not described herein again.

Figure 16:
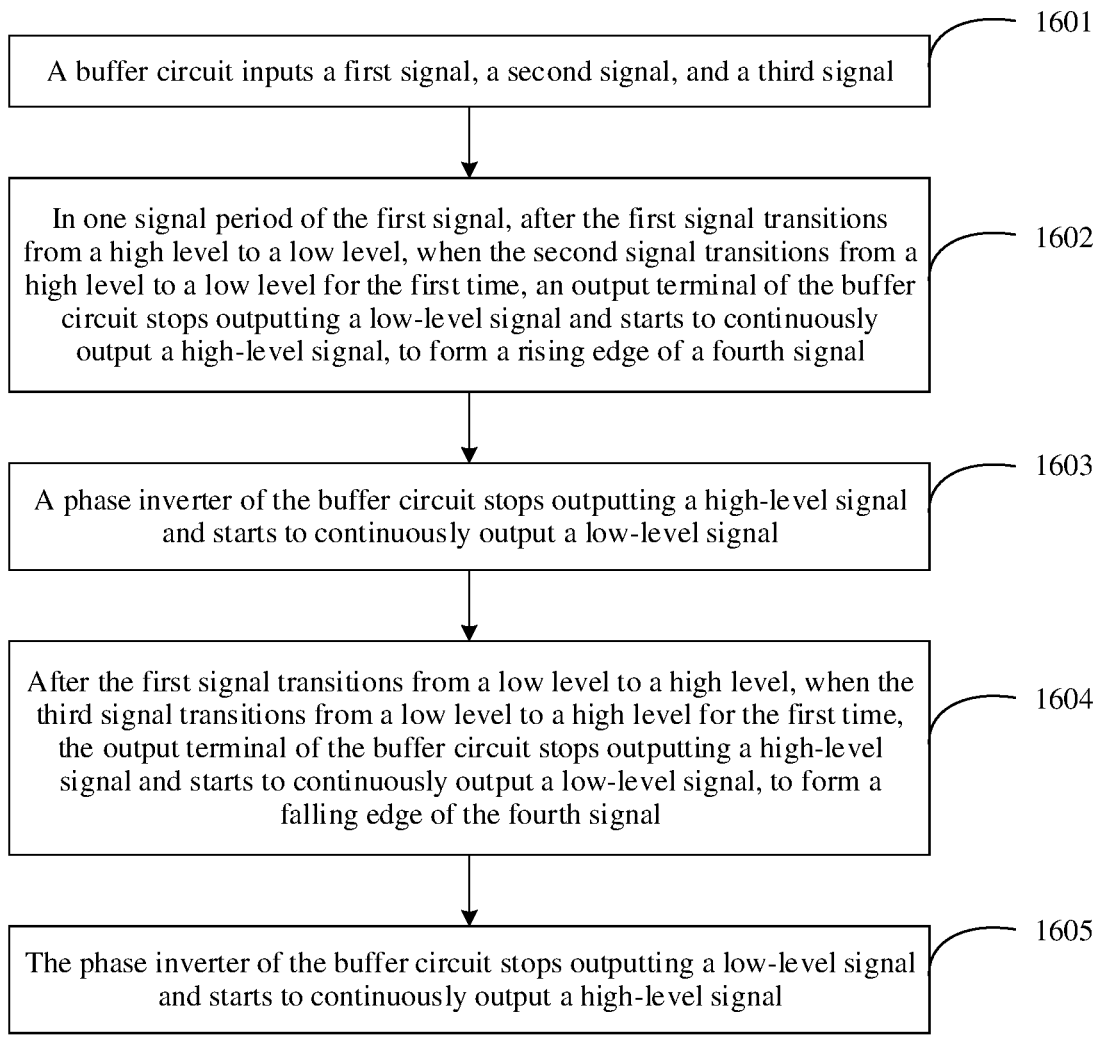
FIG. 16 is a schematic flowchart of a signal processing method according to an embodiment of this application.

An embodiment of this application further provides a signal processing method. The method is applied to the buffer circuit 10 described in FIG. 1 to FIG. 12. The buffer circuit 10 is coupled to the frequency divider 20, and the frequency divider 20 is configured to perform frequency division on a group of differential signals, to obtain at least two frequency-divided first signals. The group of differential signals includes a second signal and a third signal. FIG. 16 is a schematic flowchart of the signal processing method provided in this embodiment of this application. The method may include the following steps.

1601. The buffer circuit 10 inputs a first signal, a second signal, and a third signal.

In this embodiment of this application, the buffer circuit 10 may include a buffer 100, a first control circuit 200, and a second control circuit 300. The buffer 100 may input the first signal, and perform gain amplification on the first signal. The first control circuit 200 may input the second signal, and the second control circuit 300 may be configured to input the third signal.

1602. In one signal period of the first signal, after the first signal transitions from a high level to a low level, when the second signal transitions from a high level to a low level for the first time, the output terminal 400 of the buffer circuit stops outputting a low-level signal and starts to continuously output a high-level signal, to form a rising edge of a fourth signal.

In this embodiment of this application, the buffer 100 may further include the output terminal 400, the buffer 100 may include a first transistor 101 and a second transistor 102, the first control circuit 200 may include a third transistor 201, and the second control circuit 300 may include a fourth transistor 301. Each signal period of the first signal includes one complete high-level signal and one complete low-level signal.

In this embodiment of this application, in one signal period of the first signal, after the first signal transitions from a high level to a low level, the first transistor 101 is connected, but the third transistor 201 is not connected. When the second signal transitions from a high level to a low level for the first time, the third transistor 201 is connected, and the output terminal 400 of the buffer circuit stops outputting a low-level signal and starts to continuously output a high-level signal, to form the rising edge of the fourth signal, where the fourth signal is a signal adjusted by the buffer circuit 10.

1603. The phase inverter 500 of the buffer circuit stops outputting a high-level signal and starts to continuously output a low-level signal.

In this embodiment of this application, the buffer 100 may further include the phase inverter 500. The phase inverter 500 is connected in series to the output terminal 400, and is configured to invert the input fourth signal. After the output terminal 400 of the buffer circuit stops outputting a low-level signal and starts to continuously output a high-level signal, to form the rising edge of the fourth signal, the phase inverter 500 may stop outputting a high-level signal and start to continuously output a low-level signal, to invert the fourth signal to form a falling edge of the fourth signal.

It should be understood that step 1603 is an optional step. If step 1603 does not exist, step 1604 may be directly performed after step 1602 is performed.

1604. After the first signal transitions from a low level to a high level, when the third signal transitions from a low level to a high level for the first time, the output terminal 400 of the buffer circuit stops outputting a high-level signal and starts to continuously output a low-level signal, to form the falling edge of the fourth signal.

In this embodiment of this application, in one signal period of the first signal, after the first signal transitions from a low level to a high level, the second transistor 102 is connected, but the fourth transistor 301 is not connected. When the third signal transitions from a low level to a high level for the first time, the fourth transistor 301 is connected, and the output terminal 400 of the buffer circuit stops outputting a high-level signal and starts to continuously output a low-level signal, to form the falling edge of the fourth signal.

1605. The phase inverter 500 of the buffer circuit stops outputting a low-level signal and starts to continuously output a high-level signal.

In this embodiment of this application, after the output terminal 400 of the buffer circuit stops outputting a high-level signal and starts to continuously output a low-level signal, to form the falling edge of the fourth signal, the phase inverter 500 may stop outputting a low-level signal and start to continuously output a high-level signal, to invert the fourth signal to form the rising edge of the fourth signal.

It should be understood that when step 1603 and step 1605 exist, a sequence of performing steps 1604 and 1605 and steps 1602 and 1603 is not limited in this application. Steps 1604 and 1605 may be performed before steps 1602 and 1603. Alternatively, steps 1602 and 1603 may be performed before steps 1604 and 1605. If step 1603 and step 1605 do not exist, a sequence of performing step 1604 and step 1602 is not limited in this application. Step 1604 may be performed before step 1602, or step 1602 may be performed before step 1604.

In this embodiment of this application, delay control is performed on the rising edge and the falling edge of the frequency-divided fourth signal by using the second signal and the third signal on which no frequency division is performed, to cancel frequency divider noise introduced into the frequency-divided fourth signal.

Further, the output terminal 400 may be further coupled to the phase inverter 500, to provide a sufficiently strong drive capability for the fourth signal. In addition, a structure of the phase inverter 500 is simple, so that a connection is easy, to improve feasibility of this solution.

The buffer circuit 10, the frequency dividing circuit 1, the network device, and the components provided in this application are described in detail above. Specific implementations of this application are described herein through specific examples. The description about the embodiments is merely provided to help understand the method and core ideas of the present application. In addition, persons of ordinary skill in the art can make variations and modifications to this application in terms of the specific implementations and application scopes according to the ideas of the present application. Therefore, the content of this specification shall not be construed as a limit to this application.

What is claimed is:

1. A buffer circuit, wherein the buffer circuit comprises a buffer, a first control circuit, and a second control circuit, wherein
  the buffer is coupled to a frequency divider, and the buffer is configured to receive a first signal output by the frequency divider, and output a fourth signal by using an output terminal of the buffer circuit when driven by the first signal, wherein the first signal is obtained by the frequency divider by performing frequency division on a group of differential signals, and the differential signals comprise a second signal and a third signal;
  the first control circuit is configured to perform delay control on a rising edge of the fourth signal based on the second signal; and
  the second control circuit is configured to perform delay control on a falling edge of the fourth signal based on the third signal;
  the buffer comprises a first transistor and a second transistor, the first control circuit comprises a third transistor, and the second control circuit comprises a fourth transistor;
  the first transistor and the third transistor are coupled between the output terminal and a power terminal of the buffer circuit;
  the second transistor and the fourth transistor are coupled between the output terminal and a grounding terminal of the buffer circuit;
  each of the first transistor and the third transistor is a switching transistor that is connected at a low level and disconnected at a high level, and each of the second transistor and the fourth transistor is a switching transistor that is disconnected at a low level and connected at a high level; and the output terminal is connected to:
the first transistor and the fourth transistor; or
the third transistor and the second transistor.

2. The buffer circuit according to claim 1, wherein
the first transistor and the second transistor are configured to input the first signal;
the third transistor is configured to input the second signal; in each signal period of the first signal, after the first signal transitions from a high level to a low level, the first transistor is connected; and when the second signal transitions from a high level to a low level for the first time, the third transistor is connected, and the output terminal stops outputting a low-level signal and starts to continuously output a high-level signal, to form the rising edge of the fourth signal; and
the fourth transistor is configured to input the third signal; in each signal period of the first signal, after the first signal transitions from a low level to a high level, the second transistor is connected; and when the third signal transitions from a low level to a high level for the first time, the fourth transistor is connected, and the output terminal stops outputting a high-level signal and starts to continuously output a low-level signal, to form the falling edge of the fourth signal.

3. The buffer circuit according to claim 2, wherein the frequency divider is a divide-by-N frequency divider, and N is an integer greater than or equal to 2;
when N is greater than 2, in each signal period of the first signal, after the first signal transitions from a high level to a low level and before the first signal transitions from a low level to a high level, when the second signal transitions from a high-level signal to a low-level signal not for the first time, the output terminal continues to output a high-level signal; and
after the first signal transitions from a low level to a high level, when the third signal transitions from a low-level signal to a high-level signal not for the first time, the output terminal continues to output a low-level signal.

4. The buffer circuit according to claim 1, wherein the first signal is comprised in at least four frequency-divided first signals output by the frequency divider, the four frequency-divided first signals comprise two groups of in-phase and quadrature-phase (IQ) signals, each of the two groups of IQ signals comprises one in-phase signal I and one quadrature-phase signal Q, the group of differential signals comprises one positive signal and one negative signal, and signal types of the second signal and the third signal comprise a positive signal and a negative signal, the four frequency-divided first signals includes a positive in-phase signal, a negative in-phase signal, a positive quadrature signal and a negative quadrature signal, and each of the positive in-phase signal, the negative in-phase signal, the positive quadrature signal and the negative quadrature signal is obtained by the frequency divider by performing the frequency division on the second signal or the third signal; and in a case in which at least one of the four frequency-divided first signals is an in-phase signal I and a case in which at least one of the four frequency-divided first signals is a quadrature-phase signal Q, signal types of the second signal are opposite, and signal types of the third signal are opposite; or in a case in which at least one of the four frequency-divided first signals is an in-phase signal I and a case in which at least one of the four frequency-divided first signals is a quadrature-phase signal Q, signal types of the second signal are the same, and signal types of the third signal are the same.

5. The buffer circuit according to claim 1, wherein the buffer circuit is configured to cancel phase noise generated by the frequency divider.

6. The buffer circuit according to claim 1, wherein the differential signals comprise a second signal and a third signal, and each of the second, third and fourth signals is a square wave signal with a duty ratio of 50%;
the first control circuit is configured to perform delay control on a rising edge of the square wave signal forming the fourth signal based on the second signal; and
the second control circuit is configured to perform delay control on a falling edge of the square wave signal forming the fourth signal based on the third signal.

7. A buffer circuit, comprising a buffer, a second P-type MOS transistor, and a second N-type MOS transistor, wherein
the buffer comprises a first P-type MOS transistor and a first N-type MOS transistor, gates of the first P-type MOS transistor and the first N-type MOS transistor are separately coupled to an input terminal, a source of the first P-type MOS transistor is coupled to a power terminal, a drain of the first P-type MOS transistor is coupled to an output terminal, a source of the first N-type MOS transistor is coupled to a grounding terminal, and a drain of the first N-type MOS transistor is coupled to the output terminal;
the second P-type MOS transistor is configured to control connection or disconnection between the output terminal and the power terminal; and
the second N-type MOS transistor is configured to control connection or disconnection between the output terminal and the grounding terminal, wherein the buffer is coupled to a frequency divider;
the gates of the first P-type MOS transistor and the first N-type MOS transistor are configured to input a first signal;
a gate of the second P-type MOS transistor is configured to input a second signal, a source of the second P-type MOS transistor is coupled to the power terminal, and a drain of the second P-type MOS transistor is coupled to the output terminal;
a gate of the second N-type MOS transistor is configured to input a third signal, a source of the second N-type MOS transistor is coupled to the grounding terminal, and a drain of the second N-type MOS transistor is coupled to the output terminal; and
the output terminal is connected to:
the first P-type MOS transistor and the second N-type MOS transistor; or
the second P-type MOS transistor and the first N-type MOS transistor.

8. The buffer circuit according to claim 7, wherein
the source of the second P-type MOS transistor is connected to the power terminal, the drain of the second P-type MOS transistor is connected to the source of the first P-type MOS transistor, and the drain of the first P-type MOS transistor is connected to the output terminal; and
the source of the first N-type MOS transistor is connected to the grounding terminal, the drain of the first N-type MOS transistor is connected to the source of the second N-type MOS transistor, and the drain of the second N-type MOS transistor is connected to the output terminal.

9. The buffer circuit according to claim 7, wherein
the source of the first P-type MOS transistor is connected to the power terminal, the drain of the first P-type MOS transistor is connected to the source of the second P-type MOS transistor, and the drain of the second P-type MOS transistor is connected to the output terminal; and
the source of the second N-type MOS transistor is connected to the grounding terminal, the drain of the second N-type MOS transistor is connected to the source of the first N-type MOS transistor, and the drain of the first N-type MOS transistor is connected to the output terminal.

10. The buffer circuit according to claim 7, wherein the buffer circuit further comprises a phase inverter, and the phase inverter is coupled to the output terminal.

11. The buffer circuit according to claim 7, wherein the buffer circuit is configured to cancel phase noise generated by the frequency divider.

12. The buffer circuit according to claim 7, where a gate of the second P-type MOS transistor is configured to input a second signal, a gate of the second N-type MOS transistor is configured to input a third signal, the output terminal is configured to output an output signal, and each of the first, second and output signals is a square wave signal with a duty ratio of 50%.

13. A buffer circuit, comprising a buffer, a second PNP transistor, and a second NPN transistor, wherein
the buffer comprises a first PNP transistor and a first NPN transistor, bases of the first PNP transistor and the first NPN transistor are separately coupled to an input terminal, an emitter of the first PNP transistor is coupled to a power terminal, a collector of the first PNP transistor is coupled to an output terminal, an emitter of the first NPN transistor is coupled to a grounding terminal, and a collector of the first NPN transistor is coupled to the output terminal;
the second PNP transistor is configured to control connection or disconnection between the output terminal and the power terminal; and
the second NPN transistor is configured to control connection or disconnection between the output terminal and the grounding terminal, wherein the buffer is coupled to a frequency divider;
the bases of the first PNP transistor and the first NPN transistor are configured to input a first signal;
a base of the second PNP transistor is configured to input a second signal, an emitter of the second PNP transistor is coupled to the power terminal, and a collector of the second PNP transistor is coupled to the output terminal;
a base of the second NPN transistor is configured to input a third signal, an emitter of the second NPN transistor is coupled to the grounding terminal, and a collector of the second NPN transistor is coupled to the output terminal; and
the output terminal is connected to:
the first PNP transistor and the second NPN transistor; or
the second PNP transistor and the first NPN transistor.

14. The buffer circuit according to claim 13, wherein the buffer circuit is configured to cancel phase noise generated by the frequency divider.

15. The buffer circuit according to claim 13, wherein a base of the second PNP transistor is configured to input a second signal, a base of the second NPN transistor is configured to input a third signal, the output terminal is configured to output an output signal, and each of the first, second and output signals is a square wave signal with a duty ratio of 50%.

* * * * *